(12) United States Patent
Tedde et al.

(10) Patent No.: US 12,433,044 B2
(45) Date of Patent: Sep. 30, 2025

(54) APPARATUSES FOR RADIATION DETECTION INCLUDING ABSORBER TILES WITH A SEMICONDUCTOR MATERIAL OR A PEROVSKITE MATERIAL DISPOSED BETWEEN THE ABSORBER TILES AND METHODS OF MANUFACTURING THE SAME

(71) Applicant: Siemens Healthcare AG, Forchheim (DE)

(72) Inventors: Sandro Francesco Tedde, Weisendorf (DE); Sarah Deumel, Erlangen-Sieglitzhof (DE); Judith Elisabeth Huerdler, Nuremberg (DE)

(73) Assignee: SIEMENS HEALTHINEERS AG, Forchheim (DE)

( * ) Notice: Subject to any disclaimer, the term of this patent is extended or adjusted under 35 U.S.C. 154(b) by 223 days.

(21) Appl. No.: 17/705,750

(22) Filed: Mar. 28, 2022

(65) Prior Publication Data
US 2022/0359128 A1 Nov. 10, 2022

(30) Foreign Application Priority Data
Mar. 30, 2021 (EP) .................................... 21165773

(51) Int. Cl.
*H10F 39/12* (2025.01)
*G01T 1/24* (2006.01)
(Continued)

(52) U.S. Cl.
CPC ........... *H10F 39/195* (2025.01); *G01T 1/241* (2013.01); *H01G 9/0036* (2013.01);
(Continued)

(58) Field of Classification Search
CPC .. H01G 9/2068; H01G 9/0036; H01G 9/2009; G01T 1/241; G01T 1/20;
(Continued)

(56) References Cited

U.S. PATENT DOCUMENTS 5,556,716 A * 9/1996 Herron ..................... G03G 5/08
428/688
6,784,432 B2 * 8/2004 Wieczorek ............ G01T 1/2006
250/367
(Continued)

FOREIGN PATENT DOCUMENTS

CN 102628953 A 8/2012
CN 104570041 A 4/2015
(Continued)

OTHER PUBLICATIONS

Extended European Search Report for EP Application No. 21165773.9 mailed Sep. 29, 2021.
(Continued)

*Primary Examiner* — Caleb E Henry
(74) *Attorney, Agent, or Firm* — Harness, Dickey & Pierce, P.L.C.

(57) ABSTRACT

Example embodiments generally relate to a detector for electromagnetic radiation such as a detector comprising a first, pixelated electrode layer comprising a plurality of electrode pixels, a first layer comprising a plurality of tiles comprising a material configured to absorb and convert the electromagnetic radiation, and a second electrode layer, as well as a method of producing a detector for electromagnetic radiation, comprising providing a first, pixelated electrode layer comprising a plurality of electrode pixels, applying a plurality of tiles comprising a material configured to absorb
(Continued)

and convert the electromagnetic radiation on the first, pixelated electrode layer, and applying a second electrode layer on the first layer.

16 Claims, 8 Drawing Sheets

(51) Int. Cl.
| | | |
|---|---|---|
| *H01G 9/00* | (2006.01) | |
| *H01G 9/20* | (2006.01) | |
| *H10K 30/30* | (2023.01) | |
| *H10K 39/36* | (2023.01) | |
| *H10K 71/12* | (2023.01) | |
| *H10K 71/40* | (2023.01) | |

(52) U.S. Cl.
CPC ......... *H01G 9/2009* (2013.01); *H01G 9/2068* (2013.01); *H10K 30/30* (2023.02); *H10K 39/36* (2023.02); *H10K 71/12* (2023.02); *H10K 71/40* (2023.02)

(58) Field of Classification Search
CPC ......... G01T 1/24; G01T 1/242; G01T 1/1603; G01T 1/202; G01T 1/2023; H10K 30/30; H10K 39/36; H10K 71/12; H10K 71/40; H01L 27/14603; H01L 27/14636; H01L 27/14659; H01L 27/14676; H10F 39/195; H10F 39/1892; H10F 39/802; H10F 39/811

See application file for complete search history.

(56) References Cited

U.S. PATENT DOCUMENTS

| | | | | |
|---|---|---|---|---|
| 7,054,408 B2* | 5/2006 | Jiang | ...................... | G21K 1/02 |
| | | | | 378/19 |
| 7,106,828 B2* | 9/2006 | Chopra | ................... | H01J 47/02 |
| | | | | 250/374 |
| 7,335,891 B2* | 2/2008 | Kniss | ........................ | G01T 3/06 |
| | | | | 250/370.11 |
| 7,388,201 B2* | 6/2008 | Cholewa | ................... | G01T 1/28 |
| | | | | 313/105 R |
| 8,044,476 B2* | 10/2011 | Hatanaka | ............ | H10F 39/1895 |
| | | | | 257/E31.086 |
| 8,754,379 B2* | 6/2014 | Antonuk | ............... | H10F 39/811 |
| | | | | 250/361 R |
| 9,529,097 B1* | 12/2016 | Dolinsky | .............. | G01T 1/2002 |
| 9,905,607 B2* | 2/2018 | Liu | ........................ | H10F 39/803 |
| 11,573,336 B2* | 2/2023 | Deumel | ................. | G01T 1/1603 |
| 11,581,359 B2* | 2/2023 | Deumel | ............ | H01L 27/14632 |
| 2005/0098732 A1* | 5/2005 | Liu | ..................... | H01L 27/1462 |
| | | | | 250/370.11 |
| 2009/0008561 A1* | 1/2009 | Nagarkar | ................ | G01T 1/202 |
| | | | | 250/361 R |
| 2009/0045346 A1 | 2/2009 | Von Kanel et al. | | |
| 2009/0202043 A1* | 8/2009 | Cantu | .................... | G01N 23/04 |
| | | | | 359/885 |
| 2012/0121067 A1 | 5/2012 | Hayden et al. | | |
| 2012/0181440 A1 | 7/2012 | Kim et al. | | |
| 2012/0201350 A1 | 8/2012 | Kim | | |
| 2013/0126744 A1* | 5/2013 | Jansen | ................. | H01L 31/085 |
| | | | | 257/E31.127 |
| 2013/0126998 A1* | 5/2013 | Shahar | ................. | H01L 31/115 |
| | | | | 438/57 |
| 2013/0161772 A1* | 6/2013 | Chan | ..................... | H01L 31/055 |
| | | | | 257/E31.129 |
| 2015/0108358 A1 | 4/2015 | Sasaki et al. | | |
| 2015/0194459 A1* | 7/2015 | Rusian | .................... | G01T 1/161 |
| | | | | 257/428 |
| 2015/0249170 A1 | 9/2015 | Snaith et al. | | |
| 2016/0313452 A1 | 10/2016 | Hartmann et al. | | |
| 2017/0160405 A1* | 6/2017 | Kim | ....................... | G01T 1/201 |
| 2017/0170412 A1 | 6/2017 | Kanitz et al. | | |
| 2018/0106910 A1* | 4/2018 | Verbakel | ................. | G01T 1/241 |
| 2018/0136344 A1* | 5/2018 | Nelson | ............... | G01T 1/20181 |
| 2018/0192967 A1* | 7/2018 | Koehler | .............. | A61B 6/4233 |
| 2018/0240842 A1 | 8/2018 | Meylan et al. | | |
| 2018/0277608 A1* | 9/2018 | Lifka | ..................... | H10K 39/36 |
| 2018/0286923 A1 | 10/2018 | Fischer et al. | | |
| 2018/0294106 A1 | 10/2018 | Qi et al. | | |
| 2019/0123110 A1* | 4/2019 | Fischer | .................. | H10K 39/36 |
| 2019/0154851 A1* | 5/2019 | Wieczorek | ............. | G01T 1/242 |
| 2019/0288026 A1 | 9/2019 | Von Kaenel | | |
| 2020/0257006 A1 | 8/2020 | Abe et al. | | |
| 2021/0239859 A1* | 8/2021 | Deumel | ................. | H10K 39/36 |
| 2021/0242273 A1* | 8/2021 | Deumel | ............ | H01L 27/14663 |

FOREIGN PATENT DOCUMENTS

| | | |
|---|---|---|
| CN | 105829914 A | 8/2016 |
| DE | 102014225543 A1 | 6/2016 |
| DE | 102015225145 A1 | 6/2017 |
| EP | 2026383 A2 | 2/2009 |
| EP | 2453263 A2 | 5/2012 |
| EP | 3376260 A1 | 9/2018 |
| EP | 3304611 B1 | 9/2019 |
| EP | 3863059 A1 | 8/2021 |
| JP | 6279813 B2 | 2/2018 |
| KR | 20180098915 A | 9/2018 |
| WO | WO 2014045021 A1 | 3/2014 |
| WO | WO 2017145858 A1 | 8/2017 |

OTHER PUBLICATIONS

European Communication under Rule 71(3) for EP Application No. 21165773.9 mailed Jan. 27, 2023.
European Communication under Rule 71(3) for EP Application No. 21165773.9 mailed Jan. 9, 2023.
Teleddyne Dalsa:"Xineos Large Area Detectors" Date of screenshot: Jan. 12, 2021.
Li, C. et. al., "Methylamine gas based synthesis and healing process toward upscaling of perovskite solar cells: Progress and perspective", Solar RRL, 1(9), 1700076, 2017.

* cited by examiner

APPARATUSES FOR RADIATION DETECTION INCLUDING ABSORBER TILES WITH A SEMICONDUCTOR MATERIAL OR A PEROVSKITE MATERIAL DISPOSED BETWEEN THE ABSORBER TILES AND METHODS OF MANUFACTURING THE SAME

PRIORITY STATEMENT

The present application hereby claims priority under 35 U.S.C. § 119 to European patent application number EP 21165773.9 filed Mar. 30, 2021, the entire contents of which are hereby incorporated herein by reference.

FIELD

Example embodiments generally relate to detectors for electromagnetic radiation such as detectors comprising a first, pixelated electrode layer comprising a plurality of electrode pixels a first layer comprising a plurality of tiles comprising a material absorbing and converting the electromagnetic radiation, and, a second electrode layer, as well as a method of producing a detector for electromagnetic radiation, comprising providing a first, pixelated electrode layer comprising a plurality of electrode pixels, applying a plurality of tiles comprising a material absorbing and converting the electromagnetic radiation on the first, pixelated electrode layer, and applying a second electrode layer on the first layer.

BACKGROUND

Detectors for X-ray and/or gamma radiation find a manifold of applications, e.g. in medical diagnostics. Detection of the radiation can thereby be based on direct conversion or indirect conversion. For direct conversion, a particle is excited in an absorption layer, resulting in the formation of an electron-hole-pair that can be travel due to an applied electric field. For indirect conversion the radiation excites a scintillation material, which results in the formation of photons. The photons can then be converted in a photon detector to a charge, which again can be detected by applying an electric field. A further detection method is using hybrid-organic detectors, as e.g. disclosed in EP 20155403.7, where the problem of adhesion of the absorption layer on the substrate was addressed.

However, another problem in the production of detectors for X-ray and/or gamma radiation, particularly X-ray detectors, and particularly those employing soft-sintered layers, e.g. comprising or even consisting of perovskite, is in the production of the absorber layers, e.g. for direct conversion, as this requires relatively high pressures in the range of about 100 MPa. For small areas like e.g. 2×2 cm2 this equates to a weight of about 4 tons. When the area increases, the necessary weight increases with a quadratic function. As a result, a weight of about 102 tons is necessary for a detector with an active area of 10×10 cm2, of about 408 tons for 20×20 cm2, and of about 1600 tons for 40×40 cm2. This relation is shown in FIG. 1, where the increase in weight w with the lateral size s of the detector area—assuming a squared radiation detector, can be seen at a pressure of 100 MPa.

Although hydraulic presses exist that can apply such weight, they are very big and expensive. Also tools necessary for producing absorption plates/tiles, e.g. using soft-sintering of a powder, e.g. a perovskite powder, are also extremely expensive with increasing size due to the necessity to produce plates/tiles with plan-parallelism between them. Also, handling of tiles may become increasingly complicated with increasing size as the material of the absorption layers can be very brittle, as is e.g. the case for perovskite. But also for other materials, like silicon, cadmium tellurite or selenium, production of large areas is normally accompanied with large cost.

On the other hand, detectors for electromagnetic radiation, particularly X-ray and/or gamma detectors, generally require—due to insufficient optics—dimensions of the object to be imaged. Production of large-area radiation detectors, apart from the above, is a further technical challenge. When using crystalline materials like CdTe or CdZnTe or Si, the size limit is the size of the wafer.

Also geometric requirements, e.g. curved surfaces as required in computed tomography, are not easily obtainable with rigid materials like silicon or glass as backplane(e.g. for ASICs (application specific integrated circuits) or interposers), e.g. also for the conversion layer (e.g. CdTe or GOS). These technical problems were generally addressed using tiles in total modular units (as in computer tomography) as well as tiles of CMOS backplanes for flat panel X-ray detectors, e.g. of Teledyne Dalsa.

The usage of tiles is shown schematically in a comparison of two detectors of the state of the art in FIGS. 2 and 3, here in the form of large area direct converting radiation detectors.

In FIG. 2 the classical approach for a detector is depicted, with a first, pixelated electrode layer 1, optionally on a suitable substrate in the form of an active matrix backplane substrate, e.g. glass or silicon with a-Si, IGZO (indium gallium zinc oxide) or CMOS TFT circuitry including also a bottom electrode per each pixel, on the bottom; a first layer 2 comprising a material absorbing and converting electromagnetic radiation (also denominated radiation converting layer in the following), comprising e.g. a semiconductor like CdTe, a-Se, Si, GaAs, Ge, HgI2, PbO, semiconducting perovskites or other material, on top thereon; and a second electrode layer 3 on top of the first layer 2, also called top electrode.

In FIG. 3 the so-called butting approach is shown, where a dead zone in the form of a gap 4 is present between two detector assemblies as in FIG. 2, the gap 4 separating not only two first layers 2, which can be present in the form of tiles, but also two first, pixelated electrode layers 1 and two second electrode layers 3.

In the classical representation in FIG. 2 the first layer 2 as an absorber layer is larger or equal to than the pixelated area in the first, pixelated electrode layer 1, respectively of the backplane, as e.g. in a-Se flat panels detectors for mammography applications. In the butting approach in FIG. 3 used for example in CMOS flat panel X-ray detectors the first layer 2 as absorber layer is larger than or equal to the pixelated area in the first, pixelated electrode layer 1, respectively of the CMOS backplane; however at 1, 2 or 3 sides of the CMOS tile the pixelated area and the absorbing layer are coincident and going until the edge of the tile. Between the butted tiles there is always a dead area in the form of gap 4 between tiles which is not providing an imaging signal.

Using tiles of CMOS backplanes or modular units is, thus, disadvantageous in that the area between tiles is not sensitive, and thus represents a dead zone that cannot image. For flat panel X-ray detectors the dead area could be narrowed down to only one line or column of the detector, which can be seen in the raw image as a line or column without a signal (defect). However, this requires enormous care for precision in applying the tiles. The dead zones—until now—could only be reduced, but not eliminated.

In detectors of the state of the art, the dead zones are interpolated via software. However, this is extremely difficult to manage, as this requires huge precision in positioning of the tiles in the range of a pixel size Pg, which for state of the art flat panel X-ray detectors is usually in the range between and including 50 μm and 300 μm.

There thus still is a need for detectors for electromagnetic radiation that can be easily produced and that avoid problems associated with dead zones between tiles for absorbing radiation.

SUMMARY

The inventors found that the application of tiles, even smaller tiles, for absorbing and converting the electromagnetic radiation in detectors for electromagnetic radiation and application thereof on a backplane achieves not only an easier manufacturing, but also can lead to enhanced imaging when the gaps between the tiles are suitably filled with a material that can contribute to the signal in the pixels below.

At least one example embodiment is directed to a detector for electromagnetic radiation, particularly an X-ray and/or gamma detector, comprising a first pixelated electrode layer, the first pixelated electrode layer comprising a plurality of electrode pixels; a first layer comprising a plurality of tiles, the plurality of tiles comprising a material configured to absorb and convert the electromagnetic radiation, wherein the first layer comprises gaps between the tiles, wherein the gaps are filled with a material comprising at least one of a first semiconductor or at least a first perovskite, and a second electrode layer.

In at least one example embodiment, the plurality of tiles comprise at least a second perovskite, the second perovskite being the material configured to absorb and convert the electromagnetic radiation.

In at least one example embodiment, the detector for electromagnetic radiation further comprises at least one interlayer between, the first pixelated electrode and the first layer, the first layer and the second electrode layer, or the first pixelated electrode and the first layer and the first layer and the second electrode layer.

In at least one example embodiment, the detector for electromagnetic radiation further comprises a second layer between the first, pixelated electrode layer and the first layer, wherein the second layer is an adhesion promoting layer, the second layer comprises at least one of a second semiconductor, a conductor or a third perovskite.

In at least one example embodiment, the second layer is a structured layer, the second layer comprising a structure and a material comprising at least one of the second semiconductor, the conductor or the third perovskite filled at least one of (i) in the structure or (ii) surrounding the structure.

In at least one example embodiment, the tiles have a size in the range of 1×1 cm² to 50×50 cm².

In at least one example embodiment, the gaps between the tiles have a width of 0.1 pixel pitches to 50 pixel pitches, wherein a pixel pitch has a length of between and including 10 μm and 1000 μm.

In at least one example embodiment, two adjacent tiles in the first layer have a tilt angle between tiles between and including 0° and 5°.

At least one example embodiment is directed to a method of producing a detector for electromagnetic radiation, comprising providing a first pixelated electrode layer, the first pixelated electrode layer comprising a plurality of electrode pixels; optionally applying a first layer on the first pixelated electrode layer, wherein the first layer is an adhesion promoting layer, the first layer comprising at least one of a second semiconductor, a conductor or a first perovskite; applying a plurality of tiles, the plurality of tiles comprising a material configured to absorb and convert the electromagnetic radiation on the first pixelated electrode layer or on the optional first layer, wherein gaps are formed between the tiles; applying a material comprising at least one of a first semiconductor or at least a second perovskite in the gaps until the gaps are filled, the tiles and the filled gaps forming a second layer; and applying a second electrode layer on the second layer.

In at least one example embodiment, the tiles in the second layer comprise at least a third perovskite, the third perovskite being the material configured to absorb and convert the electromagnetic radiation.

In at least one example embodiment, the applying the first layer comprises applying a structure; and at least one of filling or surrounding a material at least one of in the structure or around the structure, the material comprising at least one of a second semiconductor, the conductor or the first perovskite.

In at least one example embodiment, the tiles have a size in the range of 1×1 cm² to 50×50 cm².

In at least one example embodiment, the method further comprises applying at least one interlayer at least one of between the first pixelated electrode layer and the optional first layer, between the optional first layer and the second layer or between the first pixelated electrode layer and the second layer, or between the second layer and the second electrode layer.

In at least one example embodiment, at least one of (i) the gaps between the tiles have a width of 0.1 pixel pitches to 50 pixel pitches, (ii) a pixel pitch has a length of between and including 10 μm and 1000 μm, or (iii) the gaps are filled with a liquid material, a paste or a powder comprising at least one of the first semiconductor or the second perovskite.

Further aspects and embodiments are disclosed in the dependent claims and can be taken from the following description, figures and examples, without being limited thereto.

BRIEF DESCRIPTION OF THE DRAWINGS

The enclosed drawings should illustrate embodiments and convey a further understanding thereof. In connection with the description they serve as explanation of concepts and principles of example embodiments. Other embodiments and many of the stated advantages can be derived in relation to the drawings. The elements of the drawings are not necessarily to scale towards each other. Identical, functionally equivalent and acting equal features and components are denoted in the figures of the drawings with the same reference numbers, unless noted otherwise.

DETAILED DESCRIPTION

Figure 1:
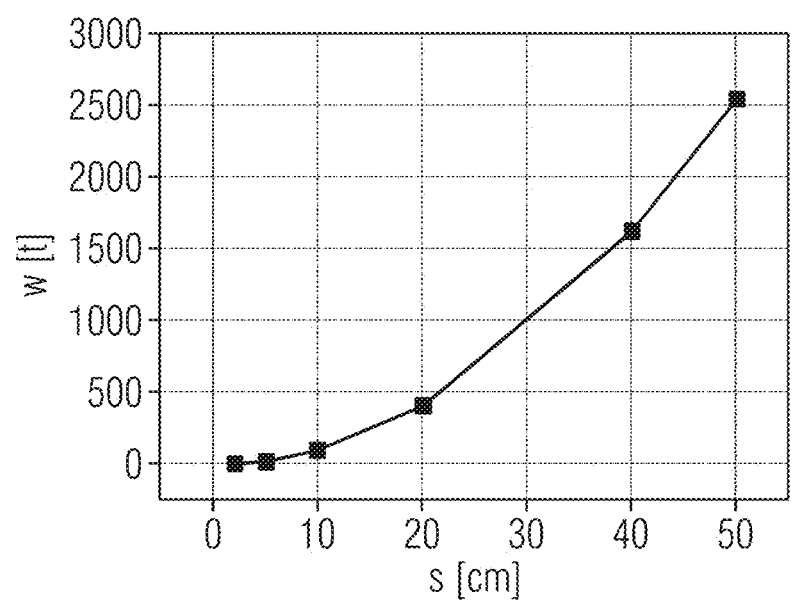
FIG. 1 shows the required pressing weight for producing tiles of absorption material at a pressure of 100 MPa for a squared radiation detector with different detector areas.
Figure 2:
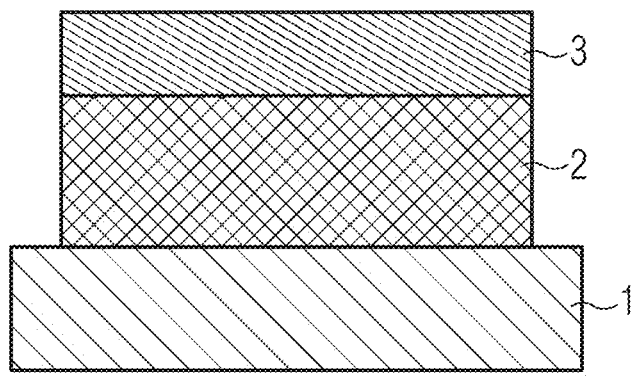
FIGS. 2 and 3 schematically show detectors for electromagnetic radiation according to the state of the art.
Figure 3:
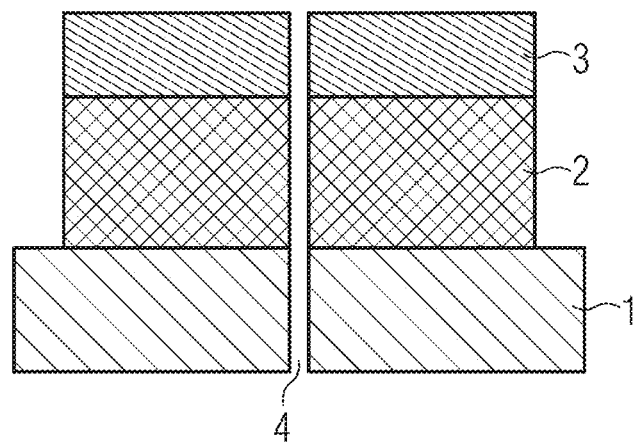

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. At least one example embodiment, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments. The present invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/ hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without subdividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one example embodiment relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the nontransitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Unless defined otherwise, technical and scientific terms used herein have the same meaning as commonly understood by one of ordinary skill in the art to which example embodiments belong.

Amounts within example embodiments are given in wt. %, unless stated otherwise or clear from context.

In the present disclosure, a reference to a conductive material refers to an electrically conductive material, unless clearly stated otherwise.

It is moreover to be understood that, in case parameter ranges are given which are delimited by numeric values, the ranges are deemed to include these limitation values.

At least one example embodiment is directed to a method of producing a detector for electromagnetic radiation, particularly an X-ray and/or gamma detector, comprising:

providing a first, pixelated electrode layer comprising a multitude of electrode pixels, optionally applying a second layer on the first, pixelated electrode layer, wherein the second layer is an adhesion promoting layer, preferably wherein the second layer comprises at least a second semiconductor and/or a conductor and/or a third perovskite, applying a multitude of tiles comprising a material absorbing and converting the electromagnetic radiation on the first, pixelated electrode layer or on the optional second layer, wherein gaps are formed between the tiles, applying a material comprising at least a first semiconductor and/or at least a first perovskite in the gaps until the gaps are filled, wherein the tiles and the filled gaps form a first layer, and applying a second electrode layer, on the first layer.

At least one example embodiment relates to a detector for electromagnetic radiation, particularly an X-ray and/or gamma detector, comprising:

a first, pixelated electrode layer comprising a multitude of electrode pixels, a first layer comprising a multitude of tiles comprising a material absorbing and converting the electromagnetic radiation, wherein the first layer comprises gaps between the tiles, wherein the gaps are filled with a material comprising at least a first semiconductor and/or at least a first perovskite, and a second electrode layer.

Particularly, the first layer is arranged between the first, pixelated electrode layer and the second electrode layer.

The present detector can particularly detect X-ray and/or gamma radiation, but preferably at least detects X-rays or particularly detects X-rays, i.e. is an X-ray detector according to certain embodiments.

In the detector the first, pixelated electrode layer comprising a multitude of electrode pixels is not particularly restricted. The number of electrode pixels is not particularly restricted but is at least 2. According to certain embodiments, the number of electrode pixels, respectively pixels, per row, is between and including 2 and 10000, e.g. between and including 2 and 1000, e.g. between and including 2 and 100. This leads for e.g. square detectors to a number of electrode pixels of e.g. 2×2 to 10000×10000, e.g. 3000× 4000. The first, pixelated electrode layer comprises at least 2 pixels, i.e. 2 or more, e.g. 3, 4, 5, 6, 7, 8, 9, 10, or more. The electrode pixels can be suitably contacted electrically. Neither the pixel size nor the material of the electrode pixels is particularly restricted, and those applied in detectors for electromagnetic radiation can be suitably applied. An electrode pixel can have a pitch of 98 μm of a square electrode pixel, but can also have any other size. The material of the electrode pixel is not particularly restricted and may comprise a conductive metal oxide, a conductive polymer and/or a metal, which serves for detection of e.g. an electron or a hole produced in the first layer.

The first, pixelated electrode layer may comprise a substrate on which the electrode pixels may be suitably arranged. The substrate, which may also be called backplane, is not particularly restricted and may be made of a material like glass, silicon, plastic, etc. For contacting the electrode pixels there may be transistors and/or electric connections for each separate pixel, the transistors being e.g. made of a-Si, IGZO or based CMOS technology, etc. The backplane also may include a lower electrode, passivation layers, e.g. comprising oxides and/or nitride, optionally anchor structures/grids, etc.

In addition, also the second electrode layer is not particularly restricted. It may comprise an electrically conductive material, e.g. a conductive metal oxide, a conductive polymer, and/or a metal. According to certain embodiments, the second electrode layer may be arranged planar. According to certain embodiments, the second electrode layer is at least partially or even totally transparent for the electromagnetic radiation to be detected, e.g. X-ray (wavelength ≥10 pm and <10 nm) and/or gamma radiation (wavelength <10 pm). For example, the second electrode layer may comprise indium tin oxide (ITO), aluminium zinc oxide (aluminium doped zinc oxide, AZO), antimony tin oxide (ATO) and/or fluorine tin oxide (FTO) as electrode material or consist thereof.

In the detector the respective electrode may be suitably connected as anode or cathode.

According to certain embodiments, a surface layer, e.g. glass and/or an encapsulation, may be arranged on the second electrode layer, opposite to the first layer, for protection, which is not particularly restricted. This can be suitably formed in a method according to at least one example embodiment.

Also, the first layer comprising a multitude of tiles comprising a material absorbing and converting the electromagnetic radiation, wherein the first layer comprises gaps between the tiles, is not particularly restricted, as long as the gaps are filled with a material comprising at least a first semiconductor and/or at least a first perovskite.

The first layer particularly consists only of the tiles and the filled gaps in the present detector.

The tiles comprising a material absorbing and converting the electromagnetic radiation in the first layer are not particularly restricted. They can be of regular, e.g. square or rectangular, shape, but can also have any other shape, or may also be irregular. According to certain embodiments they are square so that they can be arranged regularly and as close as possible so that the space of gaps can be minimized.

In the present detector, the size of the tiles in the first layer is not particularly restricted. According to certain embodiments, the tiles have a size in the range of 1×1 cm2 to 50×50 cm2, preferably between and including 5×5 cm$^2$ to 50×50 cm$^2$, further preferably between and including 10×10 cm$^2$ to 50×50 cm$^2$. With these sizes a good manufacturing of the tiles is warranted, while at the same time a good conversion in the absorption layer is achieved, and the application of the filler material in the gaps can be easily carried out. Particularly, with such size soft-sintering of the tiles, particularly if they comprise the second perovskite, is possible, and they can be easily attached. A smaller size of the tiles also enables using particularly smaller presses and tools for manufacturing thereof. In contrast to the state of the art in EP 20155403.7 where the absorption layer surface is bigger or at least the same as the active area of the pixelated electrode layer, respectively the backplane, the present detector has tiles with a size particularly smaller than the size of the first, pixelated electrode layer, so that a multitude of tiles, i.e. at least two tiles, is necessary to cover the whole surface of the first, pixelated electrode layer. If only two tiles are present, only one gap is present.

According to certain embodiments, the number of tiles in the first layer is between and including 2 and 1000, preferably between and including 2 and 100, more preferably between and including 2 and 50.

According to certain embodiments, two adjacent tiles in the first layer have a tilt angle between tiles between and including 0° and 5°. This achieves a good filling of the gaps.

Furthermore, the thickness of the tiles is not particularly restricted and can be e.g. between and including 10 μm to 10000 μm, preferably between and including 50 μm to 3000 μm, further preferably between and including 100 μm and 1500 μm, e.g. between and including 100 μm and 1000 μm.

According to certain embodiments, the gaps between the tiles are fully filled, so that no dead zone, i.e. zones not sensitive and thus not contributing to the image, remains. However, it is not excluded that a small amount of the gaps is not totally filled, e.g. if a further layer, e.g. an interlayer, is arranged on top of the first layer. In such a case less than 10 vol. %, preferably less than 5 vol. %, particularly less than 1 vol. % of the gaps may not be filled. If the whole gaps are filled, the thickness of the material in the gaps is then preferably essentially the same as the thickness of the tiles.

According to certain embodiments, the gap size g between the tiles depends on the pixel pitch Pg. According to certain embodiments, the following applies:
Pg/100≤g≤Pg*1000; preferably Pg/10≤g≤Pg*100; more preferably Pg≤g≤Pg*10

According to certain embodiments, the gaps between the tiles have a width of 0.1 pixel pitches to 50 pixel pitches, wherein a pixel pitch has a length of between and including 10 μm and 1000 μm.

According to at least one example embodiment, the gaps between tiles are filled with a material comprising at least a first semiconductor and/or at least a first perovskite, e.g. in liquid form, as paste or as solid. After a recrystallization (when using e.g. liquidized perovskite), solvent removal (e.g. when using a paste), etc. a layer comprising the at least first semiconductor and/or the at least first perovskite remains, that can contribute to the signal in the pixels below. According to certain embodiments it is ensured that the material comprising at least a first semiconductor and/or at least a first perovskite completely fills the gaps, e.g. using liquefied perovskite and/or a paste. This is comparable (figuratively) to a case where jointing mortar is applied between tiles, particularly deep into the gaps.

The material comprising at least a first semiconductor and/or at least a first perovskite in the gaps is not particularly restricted if a first semiconductor and/or at least a first perovskite is contained. According to certain embodiments, the material comprising at least a first semiconductor and/or at least a first perovskite in the gaps essentially consists of (meaning that at least 95 wt. %, at least 99 wt. % or even 99.9 wt. % of the material are the at least first semiconductor and/or first perovskite) or even consists of the at least first semiconductor and/or first perovskite. According to certain embodiments, the material comprising at least a first semiconductor and/or at least a first perovskite in the gaps only comprises a first semiconductor and/or a first perovskite, although it is not excluded that the first semiconductor and/or first perovskite are present as mixtures of first semiconductors and/or first perovskites. Apart from the first semiconductor and/or first perovskite, further materials like binders may be contained, though, in an amount of up to 30 wt. %, preferably up to 30 wt. %, further preferably up to 10 wt. %, even further preferably up to 5 wt. %, in relation to the material comprising at least a first semiconductor and/or at least a first perovskite.

The material in the gaps comprises the at least one first semiconductor and/or the at least one first perovskite. The first semiconductor and/or first perovskite may be the same as the material absorbing and converting electromagnetic radiation or may be different. According to certain embodiments, the material comprising at least a first semiconductor and/or at least a first perovskite is the same as the material absorbing and converting the electromagnetic radiation.

As some perovskites are also semiconductors, there is also an overlap between the possible materials of the first semiconductor and the first perovskite. According to certain embodiments, the gaps are filled with a material comprising at least a first perovskite, which is particularly advantageous when the material absorbing and converting the electromagnetic radiation comprises a second perovskite, which may be the same as the first perovskite or may be different.

The first semiconductor is not particularly restricted and may include at least one of mercury(II) iodide (HgI2), lead(II) iodide (PbI2), bismuth triiodide (BiI3), thallium bromide (TlBr), lead(II) oxide (PbO), cadmium telluride (CdTe), cadmium zinc telluride (CdZnTe), amorphous selenium (a-Se), Gallium Arsenide (GaAs), and/or silicon (Si). However also organic-inorganic semiconducting perovskites can be semiconductors and thus can be also considered as first semiconductor, but according to certain embodiments are not contained.

Also, the first perovskite is not particularly restricted and may contain any organic, inorganic and/or organic-inorganic perovskite, as well as mixtures thereof. For example, suitable pervoskites are described in WO 2014045021 A1, which is referred to with regard to perovskites. The perovskite may have an ABX structure, e.g. ABX3 structure, with one or more A cations, one or more B cations, and one or more anions X, particularly chosen from chalcogenides and/or halogenides, particularly halogenides, wherein the A and B cations may be organic and/or inorganic—A being particularly an organic cation chosen from alkyl, aryl, aralkyl, alkylaryl, alkenyl and/or alkinyl ammonium groups (i.e. with one, two, three, or four identical or different residues, including the organic residues and H, in the ammonium group), e.g. with 1 to 60 C atoms, and B being particularly an inorganic cation chosen particularly from cations, particularly divalent cations, of metals like Ca, Sr, Cd, Cu, Ni, Mn, Fe, Co, Pd, Ge, Sn, Pb, and lanthanides like Yb, Gd, Eu, suitable chalcogenides include oxide, sulfide, selenide, telluride, and suitable halogenides include e.g. F—, Cl—, Br—, I—, particularly Cl—, Br—, I—.

Suitable examples of perovskites as first perovskite include e.g. MAPbI3 (CH3NH3PbI3), MAPbBr3 (CH3NH3PbBr3), FAPbI3 (HC(NH2)2PbI3), MAPbICl2 (CH3NH3PbICl2), FAPbBr3 (HC(NH2)2PbBr3), EAPbI3 (CH3CH2NH3PbI3), PAPbI3 (CH3CH2CH2NH3PbI3), BA2PbI4 ((CH3CH2CH2CH2NH3)2PbI4), PMA2PbI4 ((C6H5CH2NH3)2PbI4), PEA2PbI4 ((C6H5CH2CH2NH3)2PbI4), EAPbBr3 (CH3CH2NH3PbBr3), PAPbBr3 (CH3CH2CH2NH3PbBr3); further mixed halogenides thereof; inorganic-organic perovskites with a mixture of A-cations with halogenides X (X=Cl, Br, I), e.g. MAFAPbX3 (MA=CH3NH3, FA=HC(NH2)2), MAGAPbX3 (GA=guanidinium), BAPAPbX3 (BA=CH3CH2CH2CH2NH3, PA=CH3CH2CH2NH3), etc.; organic halogenated mixtures, in which the halogens may be partially substituted by other halogens, e.g. halogenides of formula I3-xClx or Br3-xClx, etc., e.g. MAPbI3-xClx or CH3NH3PbBr3-xClx); organic and/or inorganic perovskites where Pb at least partially or even totally is substituted by Sn, Cu, Ni, Bi, Co, Fe, Mn, Cr, Cd, Ge and/or Yb, and/or mixtures thereof; inorganic perovskites and mixtures thereof, e.g. CsPbX3, wherein X=Cl, Br, and/or I, as well as mixtures thereof (e.g. CsPbBr3, CsPbI3, CsPbCl3), Cs3Bi2X9, wherein X=Cl, Br, and/or I, as well as mixtures thereof, Cs3Sb2X, wherein X=Cl, Br, and/or I, as well as mixtures thereof, Cs2AgBiX6, wherein X=Cl, Br, and/or I, as well as mixtures thereof, Rb3Bi2X9, wherein X=Cl, Br, and/or I, as well as mixtures thereof, Rb3Sb2X9, wherein X=Cl, Br, and/or I, as well as mixtures thereof, CsSnI3; etc., as well as mixtures of the perovskites.

The first perovskite may particularly be applied as liquefied perovskite and hardened, as paste, or as powder, and/or the first semiconductor may be applied as paste and/or as powder. If the material is applied as paste or as powder, suitable additives may be contained, e.g. at least a solvent and/or at least a binder.

A liquefying of the first perovskite is e.g. possible using methylamine (MA) gas, particularly in the case of methylammonium ions in the first perovskite. The process is e.g. described in EP 20155403.7 or Li, C., S. Pang, H. Xu and G. Cui. Methylamine gas based synthesis and healing process toward upscaling of perovskite solar cells: Progress and perspective. Solar RRL, 1(9), 1700076 (2017), wherein reference is made to both with regard to liquefying perovskites with methylamine gas. Due to the MA gas, the perovskite can be liquefied and subsequently be recrystallized, e.g. with changed morphology, as soon as the MA gas is not anymore in the atmosphere. After removing the methylamine gas, the perovskite can thus be recrystallized in the gaps in the present method, respectively be present in recrystallized form in the detector. Particularly, in such a case it is preferred that the first perovskite comprises an alkyl ammonium cation, wherein the alkyl groups have 1 to 4 C-atoms, particularly a methyl ammonium cation.

In such a case it also may be possible to fill a precursor, e.g. lead iodide of the perovskite and then crystallize it, as e.g. described in EP 3304611 B1.

For the application of a paste, the at least one first semiconductor and/or the at least one first perovskite may be present in the form of particles, which may be suitably mixed with at least one binder and/or at least one solvent. For this purpose, the particles, e.g. in the form of powder, may be dispersed in a suitable solvent, optionally while adding at least one binder. Suitable pastes for application are e.g. described in US 20120181440 A1 and EP 3376260 A1.

In the paste the size of the particles is not particularly restricted and may be e.g. in a range of between and including 0.01 and 600 μm, i.e. also encompass quantum dots and/or nano crystals, e.g. be in a range of between and including 1 and 300 μm, e.g. as measured by sieve analysis or laser diffraction.

If the paste contains at least one binder, the binder is not particularly restricted, and may e.g. be chosen from suitable polymeric resins, e.g. polyvinyl butyral (PVB) resin, an acryl resin, a phenoxy resin, a polyester resin, a polyvinyl formal resin, a polyamide resin, a polystyrene resin, a polycarbonate resin, a polyvinyl acetate resin, a polyurethane resin, an epoxy resin, a polyimide resin, a polyvinyl alcohol resin, a polyethylene resin, a polyester resin, a polycarbonate resin, and any mixtures thereof. The binder amount may be suitably set, based e.g. on the binder, and may be in a range of equal to or less than 30 wt. %, equal to or less than 20 wt. %, and/or more than 1 wt. %, e.g. more than 2 wt. %, based on the total amount of the paste.

If a solvent is contained in the paste, it is not particularly restricted, and may be suitably chosen, e.g. depending on the binder, e.g. from the list dipropylene glycol monomethyl ether (DPGME), butyl cellosolve (BC), y-butyrolactone, N-methyl-2-pyrrolidone, N,N-dimethylformamide, butyl cellosolve acetate (BCeA), KOCOSOL, butyl cellosolve (BC), ethyl 3-ethoxypropionate (EEP), and mixtures thereof. The amount of solvent, if contained, may be in a range of 1 wt. % to 60 wt. %, e.g. 2 wt. % to 50 wt. %, e.g. 3 wt. % to 40 wt. %, based on the total mass of the paste. In addition, the paste may further include additives such as a dispersant, an antifoaming agent, and a leveling agent.

In case the material in the gaps comprising the at least one first semiconductor and/or the at least one first perovskite is applied as a powder, it may be just applied as a powder of particles of the at least one first semiconductor and/or the at least one first perovskite, with the particles e.g. having a size in a range of between and including 0.01 and 600 μm, e.g. in a range of between and including 1 and 300 μm, as described above with regard to the paste. In such case the powder may just be filled, but can also be compacted, glued together using a suitable resin, etc.

According to certain embodiments, the material in the gaps is filled as a liquefied perovskite that is recrystallized and/or as a paste comprising the at least one first semiconductor and/or the at least one first perovskite.

In the tiles of the first layer, the material absorbing and converting the electromagnetic radiation is not particularly restricted.

For example, the material absorbing and converting the electromagnetic radiation may comprise a scintillator or even consist of the scintillator, e.g. for detecting gamma radiation, the scintillator e.g. being selected from the list consisting of CsI:Tl—thallium doped cesium iodide, terbium doped gadolinium oxysulfids, barium fluoride (BaF2), bismuth germanate (BGO), beryllium fluoride (BeF3), quantum dots, scintillating perovskite nanocrystals (the perovskite being chosen from those described with regard to the first perovskite), etc. Alternatively or in addition, the material absorbing and converting the electromagnetic radiation may comprise or consist of a second semiconductor, which may be the same as the first semiconductor or different thereof. Such second semiconductor is not particularly restricted and may include at least one of mercury(II) iodide (HgI2), lead(II) iodide (PbI2), bismuth triiodide (BiI3), thallium bromide (TlBr), lead(II) oxide (PbO), cadmium telluride (CdTe), cadmium zinc telluride (CdZnTe), amorphous selenium (a-Se), Gallium Arsenide (GaAs), and/or silicon (Si).

According to certain embodiments, the tiles in the first layer comprise at least a second perovskite as the material absorbing and converting the electromagnetic radiation, or may even consist of the second perovskite as the material absorbing and converting the electromagnetic radiation. The second perovskite may be the same as the first perovskite, or may be different thereof. According to certain embodiments, the second perovskite is the same as the first perovskite. As the first perovskite, the second perovskite is not particularly restricted and may contain any organic, inorganic and/or organic-inorganic perovskite, as well as mixtures thereof. For example, suitable pervoskites are described in WO 2014045021 A1, which is referred to with regard to perovskites. The perovskite may have an ABX structure, e.g. ABX3 structure, with one or more A cations, one or more B cations, and one or more anions X, particularly chosen from chalcogenides and/or halogenides, particularly halogenides, wherein the A and B cations may be organic and/or inorganic—A being particularly an organic cation chosen from alkyl, aryl, aralkyl, alkylaryl, alkenyl, alkinyl groups, e.g. with 1 to 20 C atoms, and B being particularly an inorganic cation chosen particularly from cations, particularly divalent cations, of metals like Ca, Sr, Cd, Cu, Ni, Mn, Fe, Co, Pd, Ge, Sn, Pb, and lanthanides like Yb, Gd, Eu, suitable chalcogenides include oxide, sulfide, selenide, telluride, and suitable halogenides include e.g. F-, Cl-, Br-, I—, particularly Cl-, Br-, I-.

Suitable examples of perovskites as second perovskite include e.g. MAPbI3 (CH3NH3PbI3), MAPbBr3 (CH3NH3PbBr3), FAPbI3 (HC(NH2)2PbI3), MAPbICl2 (CH3NH3PbICl2), FAPbBr3 (HC(NH2)2PbBr3), EAPbI3 (CH3CH2NH3PbI3), PAPbI3 (CH3CH2CH2NH3PbI3), BA2PbI4 ((CH3CH2CH2CH2NH3)2PbI4), PMA2PbI4 ((C6H5CH2NH3)2PbI4), PEA2PbI4 ((C6H5CH2CH2NH3) 2PbI4), EAPbBr3 (CH3CH2NH3PbBr3), PAPbBr3 (CH3CH2CH2NH3PbBr3); further mixed halogenides thereof; inorganic-organic perovskites with a mixture of A-cations with halogenides X (X=Cl, Br, I), e.g. MAFAPbX3 (MA=CH3NH3, FA=HC(NH2)2), MAGAPbX3 (GA=guanidinium), BAPAPbX3 (BA=CH3CH2CH2CH2NH3, PA=CH3CH2NH3), etc.; organic halogenated mixtures, in which the halogens may be partially substituted by other halogens, e.g. halogenides of formula I3-xClx or Br3-xClx, etc., e.g. MAPbI3-xClx or CH3NH3PbBr3-xClx); organic and/or inorganic perovskites where Pb at least partially or even totally is substituted by Sn, Cu, Ni, Bi, Co, Fe, Mn, Cr, Cd, Ge and/or Yb, and/or mixtures thereof; inorganic perovskites and mixtures thereof, e.g. CsPbX3, wherein X=Cl, Br, and/or I, as well as mixtures thereof (e.g. CsPbBr3, CsPbI3, CsPbCl3), Cs3Bi2X9, wherein X=Cl, Br, and/or I, as well as mixtures thereof, Cs3Sb2X, wherein X=Cl, Br, and/or I, as well as mixtures thereof, Cs2AgBiX6, wherein X=Cl, Br, and/or I, as well as mixtures thereof, Rb3Bi2X9, wherein X=Cl, Br, and/or I, as well as mixtures thereof, Rb3Sb2X9, wherein X=Cl, Br, and/or I, as well as mixtures thereof, CsSnI3; etc., as well as mixtures of the perovskites.

If the second perovskite and the first perovskite are used and are the same, the tiles still can be distinguished from the material in the gaps, though, due to the manufacturing process. Differences can be found in the morphology of the respective layer at the location of the tiles and in the gaps, e.g. regarding grain sizes, grain boundaries, density, porosity, etc. Thus, the tiles and material in the gaps can be clearly distinguished, even if the same material is used, e.g. regarding the morphology and/or the inside, which is due to the difference in production thereof. As a consequence, also the electric signal, respectively the sensitivity, may be different when comparing the tiles and the material in the gaps, even if the same chemical material is used, due to difference in morphology, etc.

According to certain embodiments, the detector further comprises at least one interlayer between the first, pixelated electrode layer and the first layer and/or the first layer and the second electrode layer. The interlayer therein is a layer that can function as an electron transport layer (respectively hole blocking layer (HBL)) or as a hole transport layer (respectively electron blocking layer (EBL)). The respective layers can be suitably set according to the charge of the respective electrodes, respectively electrode layers. The materials and thicknesses of any interlayers are not particularly restricted.

An exemplary electron transport layer (HBL) may comprise one or more of the following materials, e.g. with ≥30 wt. %, ≥50 wt. %, or ≥70 wt. %, in relation to the electron transport layer; essentially consist of one of more of these materials (e.g. with ≥90 wt. %, ≥95 wt. %, or 99 wt. %, in relation to the electron transport layer; or even consist of at least one of these materials (wherein the following list is not exhaustive and also comprises mixtures as well as isomeric mixtures of the materials, e.g. binary, ternary, quaternary mixtures, etc.): Fullerene derivatives like C60 PCBM ([6,6]-Phenyl C61 butyric acid methyl ester), C70 PCBM ([6,6]-Phenyl C71 butyric acid methyl ester), Bis-C60 PCBM (Bis-[6,6]-phenyl C61 butyric acid methyl ester), C60 oQDM (o-quinodimethane C60 mono adduct), Bis C60-oQDM (o-quinodimethane C60 bis adduct), ICMA (indene C60 mono adduct), ICBA (indene C60 bis adduct), fullerol (C60(OH)44); and other acceptors, comprising polymeric and small molecules like: dithienoindacene-based compounds like 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene (ITIC), IT-M (ITIC-M; 3,9-bis(2-methylene((3-(1,1-dicyanomethylene)-6/7-methyl)-indanone))-5,5,11,11-tetrakis(4-hexylphenyl)-dithieno[2,3-d:2',3'-d']-s-indaceno[1,2-b:5,6-b'] dithiophene), IT-DM (ITIC-DM; 3,9-bis(2-methylene-((3-(1,1-dicyanomethylene)-6,7-dimethyl)-indanone))-5,5,11,11-tetrakis(4-hexylphenyl)-dithieno[2,3-d:2',3'-d']-s-indaceno[1,2-b:5,6-b']dithiophene) and IDTBR ((5Z,5'Z)-5,5'-((7,7'-(4,4,9,9-Tetraoctyl-4,9-dihydro-s-indaceno[1,2-b:5,6-b']dithiophene-2,7-diyl)bis(benzo[c][1,2,5]thiadiazol-7,4-diyl))bis(methanylylidene))bis(3-ethylthiazolidin-2,4-dione)); perylenediimide-based compounds like TPB (tert-butylprydine, C9H13N), SdiPDI-Se (perylenediimide-derivative modified by insertion of selenophene units in the bay position), NIDCS-HO ((2E,2'E)-3,3'-(2,5-Bis(hexyloxy)-1,4-phenylene)bis(2-(5-(4-(N(2-ethylhexyl)-1,8-naphthalimid)yl)-thiophen-2-yl)acrylonitrile)); diketopyrrolopyrrole-based compounds like DPP6 (dipeptidylaminopeptidase-like protein 6), 6,6'-(Benzo[c][1,2,5]thiadiazole-4,7-diylbis([2,2'-bithiophen]-5',5-diyl))bis (2,5-bis(2-ethylhexyl)-3-(thiophene-2-yl)-2,5-dihydropyrrolo[3,4-c]pyrrol-1,4-dione) (DTDfBT(DPP)2), 6,6',6'',6'''-(9,9'-spirobi[fluorene]-2,2',7,7'-tetrayltetrakis(thiophene-5,2-diyl))tetrakis(2,5-bis(2-ethylhexyl)-3-(5-phenylthiophene-2-yl)-2,5-dihydropyrrolo[3,4-c]pyrrol-1,4-dione) (SF(DPPB)4); PFN (poly[(9,9-bis(3'-(N,N-dimethylamino)-propyl)-2,7-fluorene)-alt-2,7-(9,9-dioctylfluorene)]), PFN-OX (Poly[9,9-bis(60-(N,N-diethylamino)propyl)-fluorene-alt-9,9-bis-(3-ethyl(oxetane-3-ethyloxy)-hexyl)-fluorene]), PFO (poly(9,9-di-n-octylfluorenyl-2,7-diyl)), PPDIDTT (poly{[N,N'-bis(2-decyl-tetradecyl)3,4,9,10-perylenediimide-1,7-diyl]-alt-(dithieno[3,2-b:2',3'-d]thiophene-2,6-diyl)}), TPBi (1,3,5-tris(N-phenylbenzimidazol-2-yl)benzene); metal oxides like TiOx, SnOx, IGZO, etc.

An exemplary hole transport layer (EBL) may comprise one or more of the following materials, e.g. with ≥30 wt. %, ≥50 wt. %, or ≥70 wt. %, in relation to the hole transport layer; essentially consist of one of more of these materials (e.g. with ≥90 wt. %, ≥95 wt. %, or ≥99 wt. %, in relation to the hole transport layer; or even consist of at least one of these materials (wherein the following list is not exhaustive and also comprises mixtures as well as isomeric mixtures of the materials, e.g. binary, ternary, quaternary mixtures, etc.): poly(3-hexylthiophene-2,5-diyl) (P3HT), poly[2-methoxy-5-(2-ethylhexyloxy)-1,4-phenylenevinylene] (MEH-PPV), poly[2-methoxy-5-(3',7'-dimethyloctyloxy)-1,4-phenylenevinylene] (MDMO-PPV), CN-PPV, CN-MEH-PPV, other phthalocyanines, poly[(9,9-di-noctylfluorenyl-2,7-diyl)-alt-(benzo[2,1,3]thiadiazol-4,8-diyl)] (F8BT), polyfluorene (PF), poly[2,1,3-benzothiadiazole-4,7-diyl[4,4-bis(2-ethylhexyl)-4H-cyclopenta[2,1-b:3,4-b']dithiophene-2,6-diyl]] (PCPDTBT), squaraines (e.g. hydrazone end-capped symmetric squaraine with glycolic functionalization or diazulene squaraine), (PTT) (polythieno[3,4-b]thiophene), poly (5,7-bis(4-decanyl-2-thienyl)-thieno(3,4-b)diathiazole-thiophene-2,5) (PDDTT); diketopyrrolopyrrole-based polymers like poly{2,2'-[(2,5-bis(2-hexyldecyl)-3,6-dioxo-2,3,5,6-tetrahydropyrrolo[3,4-c]pyrrole-1,4-diyl)dithiophene]-5,5'-diyl-alt-thiophene-2,5-diyl} (PDPP3T), poly [[2,5-bis(2-hexyldecyl-2,3,5,6-tetrahydro-3,6-dioxopyrrolo[3,4 c]pyrrole-1,4-diyl]-alt-[3',3''-dimethyl-2,2': 5',2''-terthiophene]-5,5''-diyl](PMDPP3T) and the Poly{2,2'-[(2,5-bis(2-hexyldecyl)-3,6-dioxo-2,3,5,6-tetrahydropyrrolo[3,4-c]pyrrole-1,4-diyl)dithiophene]-5,5'-diyl-alt-terthiophene-2,5-diyl} (PDPP5T), poly[2,6-4,8-di(5-ethylhexylthienyl)benzo[1,2-b;3,4-b]dithiophene-alt-5-dibutyloctyl-3,6-bis(5-bromothiophene-2-yl)pyrrolo[3,4-c]pyrrole-1,4-dione] (PBDTT-DPP); dithienosilole-based polymers like poly[(4,4-bis(2-ethylhexyl)dithieno[3,2-b:2',3'-d]silole)-2,6-diyl-alt-(4,7-bis(2-thienyl)-2,1,3-benzothiadiazole)-5,5'-diyl] (PSBTBT), 7,7'-(4,4-bis(2-ethylhexyl)-4H-silolo[3,2-b:4,5-b']dithiophene-2,6-diyl)bis(6-fluoro-4-(5'-hexyl-[2,2'-bithiophene]-5-yl)benzo[c][1,2,5]thiadiazole) (p-DTS(FBTTh2)2), poly[2,7-(9,9-dioctyl-dibenzosilole)-alt-4,7-bis (thiophene-2-yl)benzo-2,1,3-thiadiazole] (PSiFDTBT), benzodithiophene-based polymers like poly[4,8-bis[(2-ethylhexyl)oxy]benzo[1,2-b:4,5-b']dithiophene-2,6-diyl-alt-3-fluoro-2-[(2-ethylhexyl)carbonyl]thieno[3,4-b]thiophene-4,6-diyl] (PTB7), poly[(2,6-(4,8-bis(5-(2-ethylhexyl) thiophene-2-yl)-benzo[1,2-b: 4,5-b']dithiophene))-alt-(5,5-(1',3'-di-2-thienyl-5',7'-bis (2-ethylhexyl)benzo[1',2'-c:4',5'-c']dithiophene-4,8-dione))]) (PBDB-T), poly{2,6'-4,8-di(5-ethylhexylthienyl)benzo[1,2-b;3,4-b]dithiophene-alt-5-dibutyloctyl-3,6-bis(5-bromothiophene-2-yl)pyrrolo[3,4-c] pyrrole-1,4-dione (PBDTT-DPP), poly[4,8-bis(5-(2-ethylhexyl)thiophene-2-yl)benzo[1,2-b;4,5-b']dithiophene-2,6-diyl-alt-(4-(2-ethylhexyl)-3-fluorothieno[3,4-b] thiophene-)-2-carboxylate-2-6-diyl)] (PBDTT-FTTE), poly [(4,8-bis-(2-ethylhexyloxy)-benzo(1,2-b:4,5-b') dithiophene)-2,6-diyl-alt-(4-(2-ethylhexanoyl)-thieno[3,4-b]thiophene-)-2-6-diyl)] (PBDTTT-C-F), PolyBenzoThiadiaZol(Thiophene)-stat-BenzoDiThiophene (Thiophene)-8 (PBTZT-stat-BDTT-8) and other polymers and copolymers and small molecules with absorption maximum between 320-800 nm; polytriarylamines and derivatives, poly[[2,5-bis(2-octyldodecyl)-2,3,5,6-tetrahydro-3,6-dioxopyrrolo[3,4-c]pyrrole-1,4-diyl]-alt2[[2,2'-(2,5-thiophene)bisthieno[3,2-b]thiophene]-5,5'-diyl]] (DPP(P)}, polyaniline (PANI), poly[(4,8-bis-(2-ethylhexyloxy)-benzo (1,2-b:4,5-b')dithiophene)-2,6-diyl-alt-(4-(2-ethylhexanoyl)-thieno[3,4-b]thiophene)-2-6-diyl)] (PBDTTT-C), poly[N29-hepta-decanyl-2,7-carbazole-alt-3,6-bis-(thiophen-5-yl)-2,5-dioctyl-2,5-dihydropyrrolo[3,4-]pyrrole-1,4-dione] (PCBTDPP), poly[[9-(1-octylnonyl)-9H-carbazole-2,7-diyl]-2,5-thiophenediyl-2,1,3-benzothiadiazole-4,7- diyl-2,5-thiophenediyl] (PCDTBT), poly[2,5-bis(2-octyldodecyl)pyrrolo [3,4-c]pyrrole-1,4 (2H, 5H)-dione-(E)-1,2-di(2,2'-bithiophen-5-yl)ethene] (PDPPDBTE), perfluoro(4-methyl-3,6-dioxaoct-7-en)sulfonylfluoride (PFI), poly(4-styrene sulfonate)-graft-polyaniline (PSS-g-PANI); 2'-butyloctyl-4,6-dibromo-3-fluorothieno[3,4-b]thiophene-2-carboxylate (TT-BO), 3',4'-dichlorobenzyl-4,6-dibromo-3-fluorothieno-[3,4-b]thiophene-2-carboxylate (TT-DCB), and 2,6-bis(trimethyl-tin)-4,8-bis(2-ethylhexyloxy)benzo[1,2-b:4,5-b']dithiophene (BDT-EH) copolymer (PTB-DCB21), N2,N2,N2',N2',N7,N7,N7',N7'-octakis(4-methoxyphenyl)-9,9'-spirobi[9H-fluorene]-2,2',7,7'-tetramine (spiro-OMeTAD), poly[(9,9-dioctylfluorenyl-2,7-diyl)-co-(4,4'-(N-(4-sec-butylphenyl)diphenylamine)] (TFB), N4,N4'-di(naphthalene-1-yl)-N4,N4'-bis(4-vinylphenyl)biphenyl-4,4'-diamine (VNPB), 1,4-bis(4-sulfonatobutoxy)benzene and thiophene moieties (PhNa-1T)); metal oxides like NiOx, MoOx, etc . . . .

According to certain embodiments, the detector further comprises a second layer between the first, pixelated electrode layer and the first layer, wherein the second layer is an adhesion promoting layer. Such second layer is not particularly restricted, as long as it achieves at least a better adhesion between the first, pixelated electrode layer and the first layer, or the first layer and an interlayer, or the first, pixelated electrode layer and an interlayer, particularly between the first, pixelated electrode layer and the first layer, or at least between the first, pixelated electrode layer and the tiles of the first layer.

The thickness of the second layer is not particularly restricted and may be in a range of between 100 nm and 1000 µm, e.g. between 200 nm and 500 µm, e.g. between 300 nm and 100 µm.

According to certain embodiments, the second layer is an anisotropic conductive film (ACF) or anisotropic conductive paste (ACP), which, may, however, according to certain embodiments, need an additional structured electrode on the respective absorber tile, and/or call for a good alignment between the electrodes on the tile and those in the first, pixelated electrode layer, e.g. on the backplane (substrate).

According to certain embodiments, the second layer comprises at least a second semiconductor and/or a conductor and/or a third perovskite.

According to certain embodiments, the second layer comprises a conductor, which is not particularly restricted, e.g. in the form of bump bonds. These bump bonds are not particularly restricted and may be made e.g. of a suitable metal, e.g. a conductive metal like Cu, Ag, Pb, Sn, In etc., as well as alloys thereof, and/or may be made in any suitable form, e.g. in the form of balls, spheres, semi-spheres, pillars, columns, cubes, etc. According to certain embodiments, the bump bonds may further be in contact with a glue, which can be e.g. introduced by an underfill process, etc., but it is also not excluded that the bump bonds are just surrounded by air, etc.

According to certain embodiments, the second layer comprises or even consists of the third perovskite, which may be the same as the first and/or second perovskite or be different. In such instance the second layer may be produced, respectively applied, as liquefied perovskite, as laid out regarding the first perovskite, and recrystallized, and/or be applied with a paste, and dried. According to certain embodiments, the second layer is made from a recrystallized perovskite, that was liquefied, e.g. with MA gas, as described above.

The third perovskite thus is not particularly restricted and may contain any organic, inorganic and/or organic-inorganic perovskite, as well as mixtures thereof. For example, suitable pervoskites are described in WO 2014045021 A1, which is referred to with regard to perovskites. The perovskite may have an ABX structure, e.g. ABX3 structure, with one or more A cations, one or more B cations, and one or more anions X, particularly chosen from chalcogenides and/or halogenides, particularly halogenides, wherein the A and B cations may be organic and/or inorganic—A being particularly an organic cation chosen from alkyl, aryl, aralkyl, alkylaryl, alkenyl, alkinyl groups, e.g. with 1 to 20 C atoms, and B being particularly an inorganic cation chosen particularly from cations, particularly divalent cations, of metals like Ca, Sr, Cd, Cu, Ni, Mn, Fe, Co, Pd, Ge, Sn, Pb, and lanthanides like Yb, Gd, Eu, suitable chalcogenides include oxide, sulfide, selenide, telluride, and suitable halogenides include e.g. F—, Cl—, Br—, I—, particularly Cl—, Br—, I—.

Suitable examples of third perovskites include e.g. MAPbI3 (CH3NH3PbI3), MAPbBr3 (CH3NH3PbBr3), FAPbI3 (HC(NH2)2PbI3), MAPbICl2 (CH3NH3PbICl2), FAPbBr3 (HC(NH2)2PbBr3), EAPbI3 (CH3CH2NH3PbI3), PAPbI3 (CH3CH2CH2NH3PbI3), BA2PbI4 ((CH3CH2CH2CH2NH3)2PbI4), PMA2PbI4 ((C6H5CH2NH3)2PbI4), PEA2PbI4 ((C6H5CH2CH2NH3) 2PbI4), EAPbBr3 (CH3CH2NH3PbBr3), PAPbBr3 (CH3CH2CH2NH3PbBr3); further mixed halogenides thereof; inorganic-organic perovskites with a mixture of A-cations with halogenides X (X=Cl, Br, I), e.g. MAFAPbX3 (MA=CH3NH3, FA=HC(NH2)2), MAGAPbX3 (GA=guanidinium), BAPAPbX3 (BA=CH3CH2CH2CH2NH3, PA=CH3CH2CH2NH3), etc.; organic halogenated mixtures, in which the halogens may be partially substituted by other halogens, e.g. halogenides of formula I3-xClx or Br3-xClx, etc., e.g. MAPbI3-xClx or CH3NH3PbBr3-xClx); organic and/or inorganic perovskites where Pb at least partially or even totally is substituted by Sn, Cu, Ni, Bi, Co, Fe, Mn, Cr, Cd, Ge and/or Yb, and/or mixtures thereof; inorganic perovskites and mixtures thereof, e.g. CsPbX3, wherein X=Cl, Br, and/or I, as well as mixtures thereof (e.g. CsPbBr3, CsPbI3, CsPbCl3), Cs3Bi2X9, wherein X=Cl, Br, and/or I, as well as mixtures thereof, Cs3Sb2X, wherein X=Cl, Br, and/or I, as well as mixtures thereof, Cs2AgBiX6, wherein X=Cl, Br, and/or I, as well as mixtures thereof, Rb3Bi2X9, wherein X=Cl, Br, and/or I, as well as mixtures thereof, Rb3Sb2X9, wherein X=Cl, Br, and/or I, as well as mixtures thereof, CsSnT3; etc., as well as mixtures of the perovskites.

According to certain embodiments, the detector for electromagnetic radiation comprises at least one interlayer between the first, pixelated electrode and the second layer and/or between the second layer and the first layer, wherein the respective interlayer can be as described above. According to certain embodiments, no interlayer is present between the first layer and the second layer.

According to certain embodiments, the second layer is a structured layer comprising a structure and a material comprising the second semiconductor and/or the conductor and/or the third perovskite filled at least in the structure and/or surrounding the structure. In such embodiments the structure is not particularly restricted, and can be in the form of a grid, pillars, etc. The structure therein serves as an anchor structure which can increase the bond between the first, pixelated electrode layer and the second layer. According to certain embodiments, the structure is as high as the further material of the second layer, or the further material, e.g. the second semiconductor and/or the conductor and/or the third perovskite, sur-passes the structure, e.g. for at least 10 nm, at least 100 nm, or even 1 µm, or even 10 µm, or even 30 μm. The grid can be suitably arranged on e.g. the first, pixelated electrode layer, using e.g. resists, laser cutting, welding, etc., for producing the structure. Suitable structures are e.g. described in EP 20155403.7, to which reference is made with regard to the structures.

Figure 4:
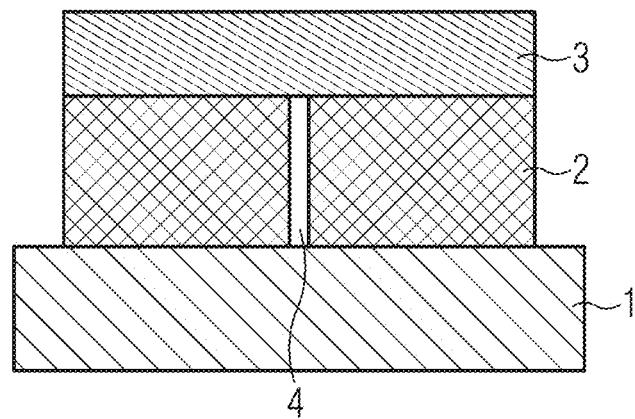
FIGS. 4 and 5 illustrate the filling of gaps between tiles in detectors for electromagnetic radiation according to at least one example embodiment.
Figure 5:
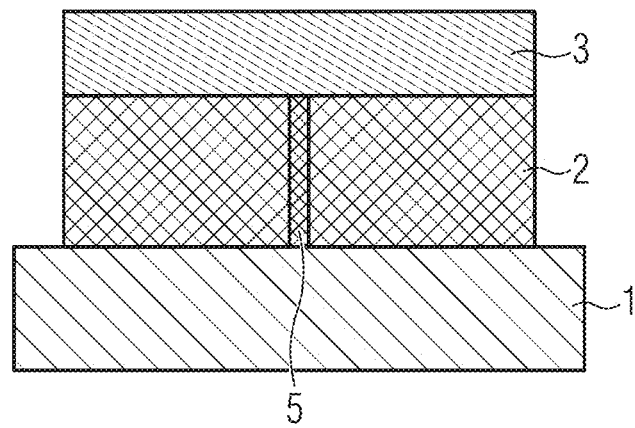

FIGS. 4 and 5 schematically show how an exemplary detector can be set up. FIG. 4 shows therein a setup with two exemplary tiles of the first layer 2 (being the radiation converting layer comprising e.g. a semiconductor like CdTe, a-Se, Si, GaAs, Ge, HgI2, PbO, semiconducting perovskites or others in the tiles, as stated above) between the first, pixelated electrode layer 1 (e.g. in the form of an active matrix backplane with a suitable substrate (glass or silicon with e.g. a-Si, IGZO or CMOS TFT circuitry) including also a bottom electrode per each pixel) and the second electrode layer 3, here representing the top electrode, the tiles 2 separated by a gap 4, the gap representing a dead zone between butted radiation conversion tiles as in the state of the art. In FIG. 5 the gap 4 is filled by a material comprising at least a first semiconductor and/or at least a first perovskite 5, e.g. a recrystallized first perovskite introduced as liquefied perovskite. As the material comprising at least a first semiconductor and/or at least a first perovskite can function as semiconductor, it can contribute to the image generation. FIGS. 4 and 5 illustrate butting the radiation conversion layer tiles on top of the backplane, and filling the gap between the radiation conversion tiles with e.g. a recrystallized radiation converting layer (semiconductor), thus eliminating completely the dead area between tiles.

Figure 6:
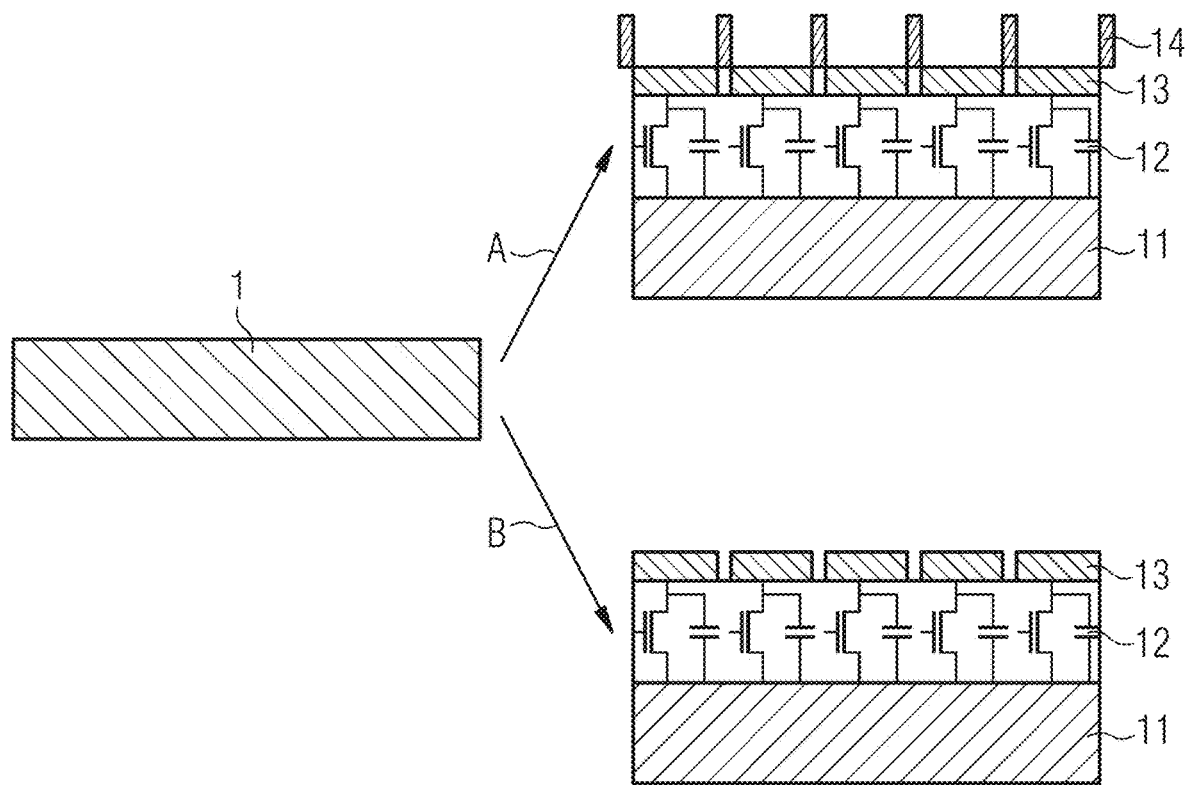
FIG. 6 illustrates two alternatives for the backplane in detectors for electromagnetic radiation according to at least some example embodiments.

FIG. 6 shows possible embodiments schematically for the first, pixelated electrode layer 1. In a variant A shown as a view with an anchoring grid structure it has a substrate 11, e.g. glass, silicon and/or plastic, a pixel circuitry 12 e.g. thin film transistors as active matrix driving scheme with storage capacitors, pixelated (structured) bottom electrodes 13 and a structure 14 working as a grid anchoring structure for connecting to the radiation detection layer. In variant B without the anchoring grid structure, this structure 14 is missing. FIG. 6 thus shows possible schematics of the radiation image sensor (e.g. X-Ray and/or gamma-ray imager) backplane cross-section with and without anchoring grid structures.

Figure 7:
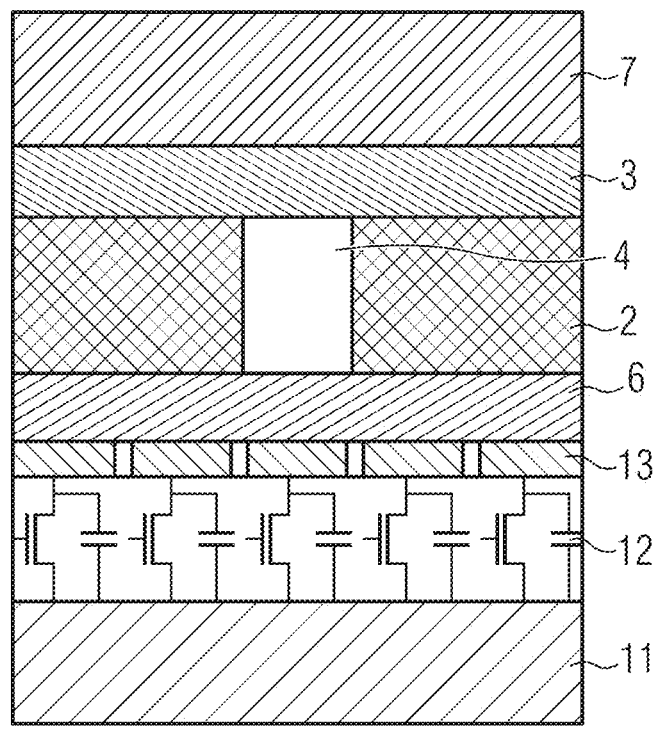
FIGS. 7, 8, 9 and 10, illustrate filling of gaps between tiles in detectors for electromagnetic radiation of with different backplanes according to at least some example embodiments.
Figure 8:
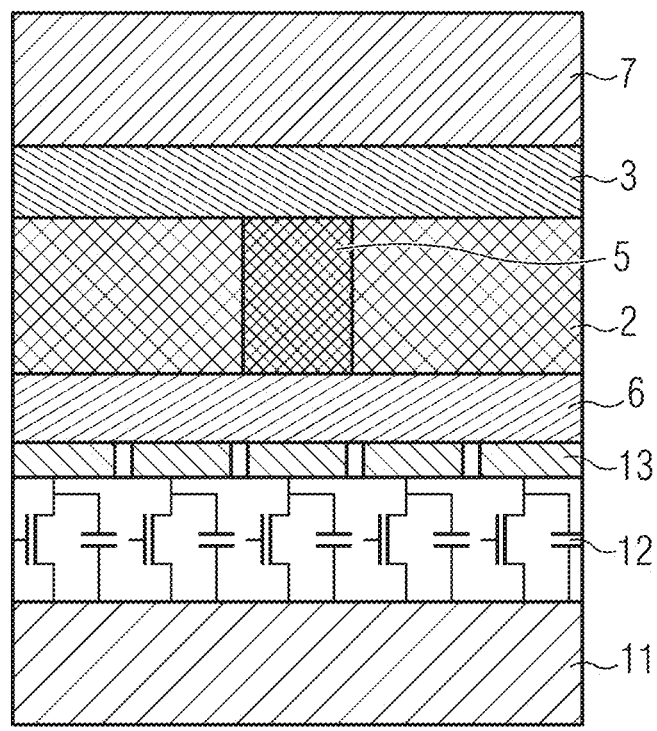

FIGS. 7 and 8 schematically show then the application of variant B of FIG. 6 with substrate 11, pixel circuitry 12 and pixelated bottom electrodes 13 to the detector in FIGS. 4 and 5 using a second layer 6 as adhesion promoting layer, i.e. showing a schematic of a possible radiation image sensor's (X-Ray and/or gamma-ray imager) cross-section with butted direct converting layer and semi-dead space between tiles in the first layer 2, being a butted converting layer with two tiles in this figure. In this setup, the pixels in correspondence of the gap between absorber tiles are already capable to deliver a signal upon irradiation due to the second layer 6 which can be semiconducting and floating, the gap 4 in FIG. 7 thus forming semi-dead areas since the signal will be low but is not zero. In FIGS. 7 and 8 additionally an encapsulation 7 is present for protecting the second electrode layer 3. In FIG. 5 the gap 4 is then again filled by a material comprising at least a first semiconductor and/or at least a first perovskite 5, e.g. a recrystallized first perovskite introduced as liquefied perovskite.

Figure 9:
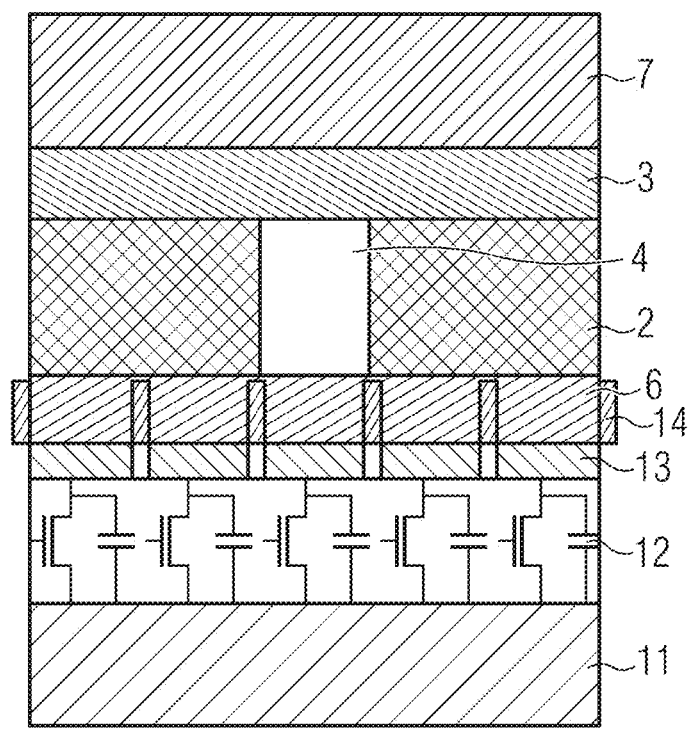
Figure 10:
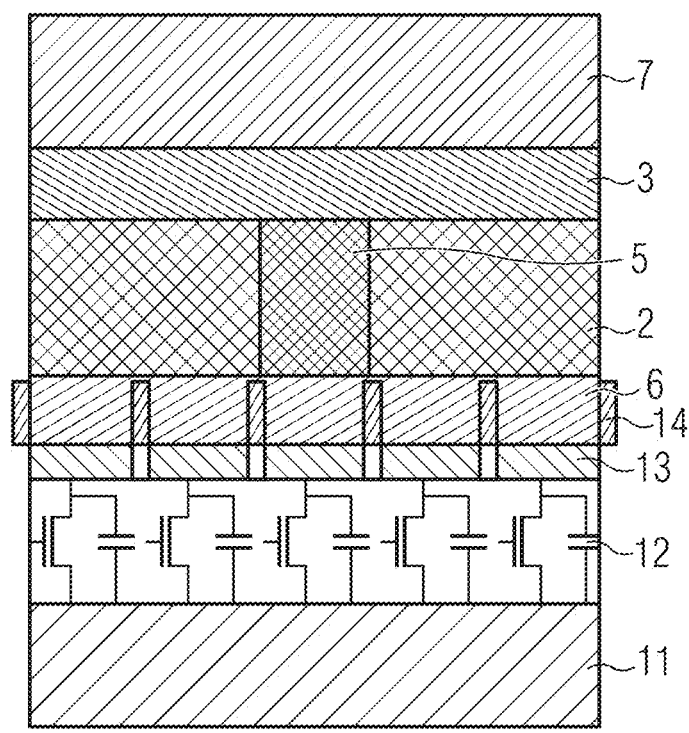

FIGS. 9 and 10 show the application of variant A of FIG. 6 to the detector of FIGS. 4 and 5. The setup of FIG. 9 corresponds to the one of FIG. 7, and the setup of FIG. 10 to the one of FIG. 8, except that the structure 14 is present in the second layer 6 in both setups in FIGS. 9 and 10 for further anchoring the second layer 6 to the first, pixelated electrode layer, achieving better binding thereof.

Additionally described is a detector of a third aspect for electromagnetic radiation, particularly an X-ray and/or gamma detector, comprising:
    a first, pixelated electrode layer comprising a multitude of electrode pixels,
    a first layer comprising a multitude of tiles comprising a material absorbing and converting the electromagnetic radiation, wherein the first layer may comprise gaps between the tiles, and
    a second electrode layer,
further comprising a second layer between the first, pixelated electrode layer and the first layer, wherein the second layer is an adhesion promoting layer, preferably wherein the second layer comprises at least a second semiconductor and/or a conductor and/or a third perovskite, optionally the detector for electromagnetic radiation of the third aspect comprising at least one interlayer between the first, pixelated electrode and the second layer and/or between the second layer and the first layer.

In the detector of the third aspect, the tiles in the first layer may comprise at least a second perovskite as the material absorbing and converting the electromagnetic radiation.

The detector of the third aspect may further comprise at least one interlayer between the first, pixelated electrode and the first layer and/or between the first layer and the second electrode layer, as well as also other layers (e.g. an encapsulation) described with regard to the detector of the first aspect.

In the detector of the third aspect the second layer may be a structured layer comprising a structure and a material comprising the second semiconductor and/or the conductor and/or the third perovskite filled at least in the structure and/or surrounding the structure.

In the detector of the third aspect the tiles may have a size in the range of 1×1 cm2 to 50×50 cm2.

In the detector of the third aspect the optional gaps between the tiles have a width of 0.1 pixel pitches to 50 pixel pitches, wherein a pixel pitch has a length of between and including 10 μm and 1000 μm.

In the detector of the third aspect two adjacent tiles in the first layer have a tilt angle between tiles between and including 0° and 5°.

In the detector of the third aspect the first, pixelated electrode layer, the first layer, the tiles comprised therein, the second electrode layer, the second layer and the interlayers, as well as the respective materials thereof, and any further layers and materials are as described with regard to the detector of the first aspect. Also, further embodiments described with regard to the detector of the first aspect are also applicable to the detector of the third aspect. With such a detector improved adhesion between the first, pixelated electrode layer and the tiles of the first layer is obtained. Consequently, the detector of the third aspect may be manufactures in the same manner as the detector of the first aspect, with the difference that the second layer is applied and the gaps between tiles in the first layer are not filled.

At least one example embodiment relates to a method of producing a detector for electromagnetic radiation, particularly an X-ray and/or gamma detector, comprising:
    providing a first, pixelated electrode layer comprising a multitude of electrode pixels,
    optionally applying a second layer on the first, pixelated electrode layer, wherein the second layer is an adhesion promoting layer, preferably wherein the second layer comprises at least a second semiconductor and/or a conductor and/or a third perovskite, applying a multitude of tiles comprising a material absorbing and converting the electromagnetic radiation on the first, pixelated electrode layer or on the optional second layer, wherein gaps are formed between the tiles, applying a material comprising at least a first semiconductor and/or at least a first perovskite in the gaps until the gaps are filled, wherein the tiles and the filled gaps form a first layer, and applying a second electrode layer, on the first layer.

With the present method particularly the detector for electromagnetic radiation according to at least one example embodiment can be produced. Thus, certain embodiments discussed with regard to the present detector for electromagnetic radiation also apply to the present method, and vice versa.

In the present method, the step of providing a first, pixelated electrode layer comprising a multitude of electrode pixels is not particularly restricted, and a first, pixelated electrode layer may be provided, as described above with regard to the present detector.

Also the step of optionally applying a second layer on the first, pixelated electrode layer, wherein the second layer is an adhesion promoting layer, preferably wherein the second layer comprises at least a second semiconductor and/or a conductor and/or a third perovskite, is not particularly restricted.

As described above the second layer can be applied e.g. as liquefied third perovskite and recrystallized, as paste and hardened, etc., and can then have a final thickness in a range of between 100 nm and 1000 µm, e.g. between 200 nm and 500 µm, e.g. between 300 nm and 100 µm.

According to certain embodiments, applying the second layer comprises applying a structure, and filling and/or surrounding a material comprising a second semiconductor and/or a conductor and/or a third perovskite at least in the structure and/or around the structure. The applying of the structure is not particularly restricted and can be done using photolithography, welding, laser cutting, atomic layer deposition, etc., e.g. as also described above with regard to the detector. When the structure is applied, it can then be filled and/or surrounded (e.g. when the structure comprises pillars) by the material comprising a second semiconductor and/or a conductor and/or a third perovskite, e.g. by applying liquefied perovskite and recrystallization, applying a paste, etc.

Furthermore, the step of applying a multitude of tiles comprising a material absorbing and converting the electromagnetic radiation on the first, pixelated electrode layer or on the optional second layer, wherein gaps are formed between the tiles is not particularly restricted either, and the tiles can be suitably attached, e.g. by pressing, gluing, or also by put-ting it on a layer below before it is hardened, e.g. the second layer before recrystallization or hardening.

According to certain embodiments, the tiles in the first layer comprise at least a second perovskite as the material absorbing and converting the electromagnetic radiation, as described above.

According to certain embodiments, the tiles have a size in the range of 1×1 cm2 to 50×50 cm2.

According to certain embodiments, the number of tiles in the first layer is between and including 2 and 1000, preferably between and including 2 and 100, more preferably between and including 2 and 50.

According to certain embodiments, two adjacent tiles in the first layer have a tilt angle between tiles between and including 0° and 5°. This achieves a good filling of the gaps.

Furthermore, the thickness of the tiles is not particularly restricted and can be e.g. between and including 10 µm to 10000 µm, preferably between and including 50 µm to 3000 µm, further preferably between and including 100 µm and 1500 µm, e.g. between and including 100 µm and 1000 µm.

According to certain embodiments, the gaps between the tiles are fully filled. However, it is not excluded that a small amount of the gaps is not totally filled, e.g. if a further layer, e.g. an interlayer, is arranged on top of the first layer, or if e.g. a metal as electric contact to the second electrode layer is arranged on the material in the gaps if the second electrode layer is arranged on top of the first layer. However, it is preferred that the material in the gap has the same height/thickness as the thickness of the tiles. Also, it is not excluded that the material in the gap is porous, i.e. has a certain porosity, e.g. of less than 10 vol. %, less than 5 vol. % or even less than 2 vol. %, e.g. even less than 1 vol. % of the total volume of the material in the gaps.

In such cases, i.e. if the gaps are not fully filled with regard to height, porosity, etc., preferably less than 10 vol. %, preferably less than 5 vol. %, more preferably less than 2 vol. %, particularly less than 1 vol. % of the gaps may not be filled. If the whole gaps are filled, the thickness of the material in the gaps is then preferably essentially the same as the thickness of the tiles.

According to certain embodiments, the gap size g between the tiles depends on the pixel pitch Pg. According to certain embodiments, the following applies: $Pg/100 \leq g \leq Pg*1000$; preferably $Pg/10 \leq g \leq Pg*100$; more preferably $Pg \leq g \leq Pg*10$ According to certain embodiments, the gaps between the tiles have a width of 0.1 pixel pitches to 50 pixel pitches, wherein a pixel pitch has a length of between and including 10 µm and 1000 µm.

In the present method also the step of applying a material comprising at least a first semiconductor and/or at least a first perovskite in the gaps until the gaps are filled, wherein the tiles and the filled gaps form a first layer, is not particularly restricted.

According to certain embodiments, the gaps are filled with a liquid material, a paste or a powder comprising at least the first semiconductor and/or at least the first perovskite. The material comprising at least a first semiconductor and/or at least a first perovskite can be in the form of a liquid, e.g. as a solution, liquid semiconductor or liquefied perovskite, paste, or solid—e.g. in the form of a powder, as described above, and be filled in the gaps using a suitable applicator, e.g. a dispensing apparatus. According to certain embodiments, the applicator which e.g. fills a liquid semiconductor and/or liquefied perovskite and/or a solution comprising the at least first semiconductor and/or the at least first perovskite, in the gaps between tiles is a dispensing robot, which optionally can be con-trolled by an artificial intelligence with automatic detection of the gaps and filling thereof. According to certain embodiments, the material comprising at least a first semiconductor and/or at least a first perovskite, e.g. in the form of a liquid, can also be applied in several steps, e.g. layer by layer, to suitably fill the gaps and/or achieve a desired layer thickness.

Finally, the step of applying a second electrode layer, on the first layer is not particularly restricted.

According to certain embodiments, a surface layer, e.g. glass and/or an encapsulation, may be applied on the second electrode layer, opposite to the first layer, for protection, which is not particularly restricted.

According to certain embodiments, the method further comprises applying at least one interlayer between the first, pixelated electrode layer and the optional second layer, and/or between the optional second layer and the first layer, or between the first, pixelated electrode layer and the first layer; and/or between the first layer and the second electrode layer. The application thereof is not particularly restricted, and the interlayers can be made of material as described above with regard to the detector.

Figure 11:
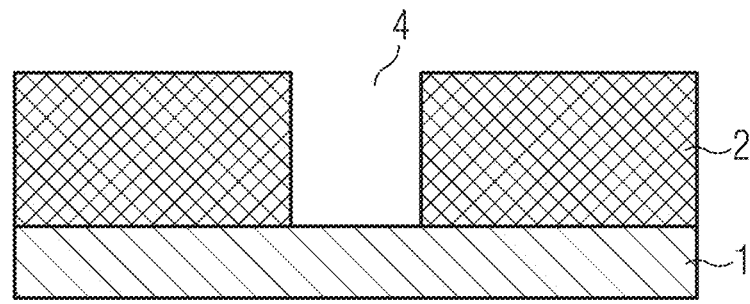
FIGS. 11 to 14 illustrate steps in a method according to at least one example embodiment.
Figure 12:
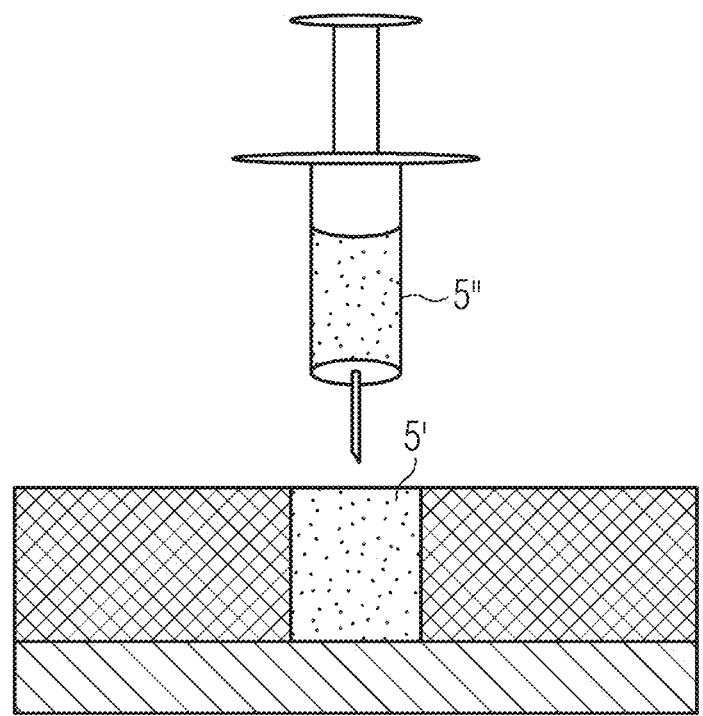
Figure 13:
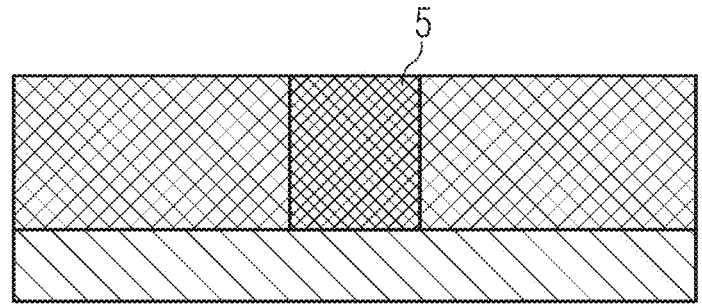
Figure 14:
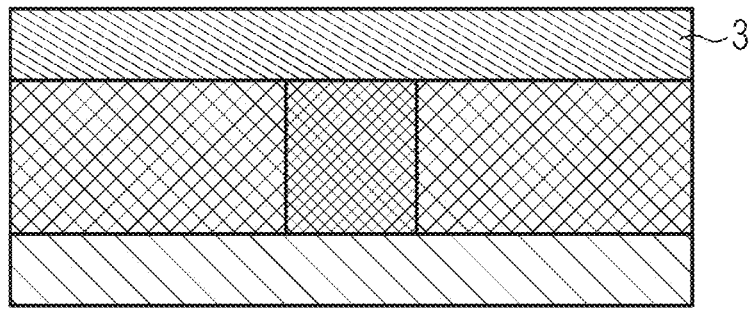

An exemplary method is shown in FIGS. 11 to 14. In FIG. 11 a part of the first layer 2, here with two tiles as a butted converting layer, is applied on the first, pixelated electrode layer 1, optionally also with a second layer as adhesion promoting layer in between (not shown), leaving a gap 4 between butted conversion layer tiles. In FIG. 12 the gap 4 is then filled, using applicator 5", e.g. a dispensing apparatus for filling the gap with liquified radiation converting material (semiconductor), with an exemplary liquid material comprising at least a first semiconductor and/or at least a first perovskite 5', which is then hardened in FIG. 13, e.g. by recrystallization of liquefied perovskite, solvent evaporation, etc. using suitable time, temperature, atmosphere pressure, to obtain the material comprising at least a first semiconductor and/or at least a first perovskite 5 in the gap in the solid state. In case a powder is filled in the gaps, a glue, top layer, etc. may be applied to close the gaps. Thereafter, the second electrode layer 3 is applied in FIG. 14 on top thereof.

Figure 15:
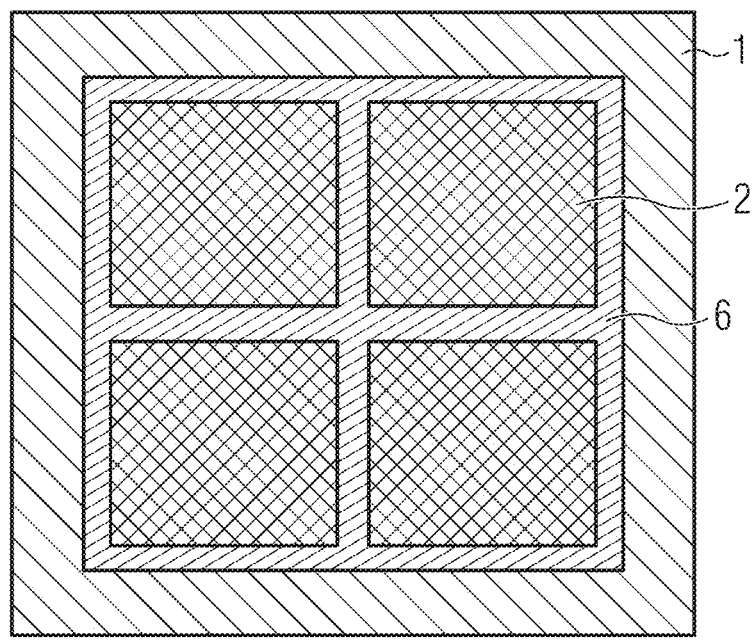
FIGS. 15 to 17 illustrate filling gaps in a method according to at least one example embodiment.
Figure 16:
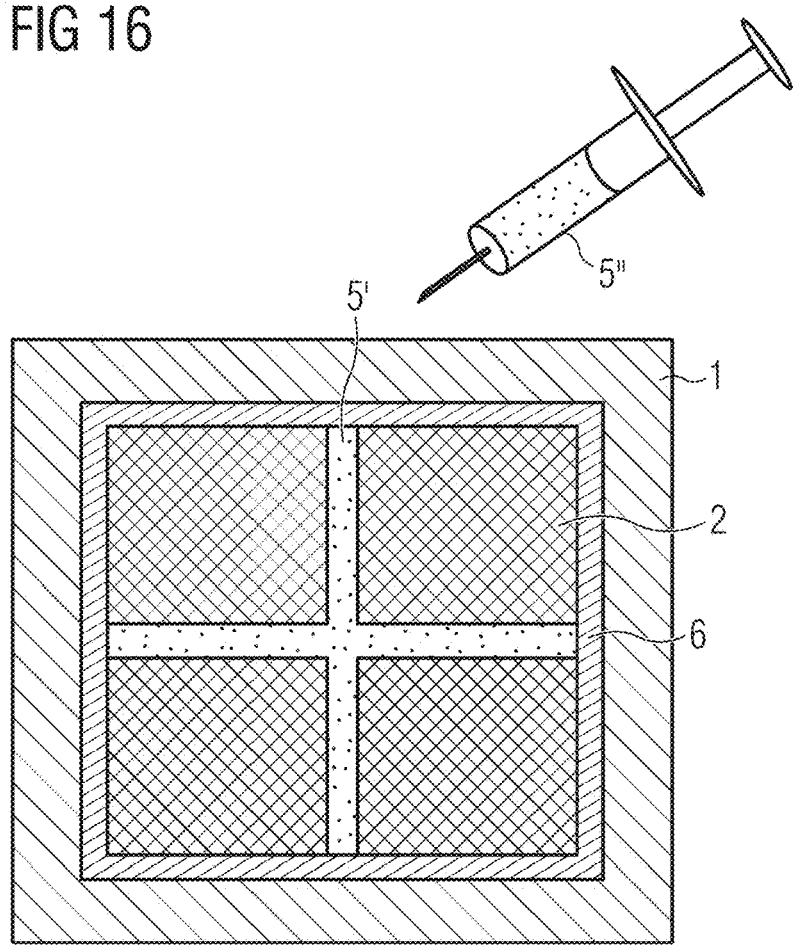
Figure 17:
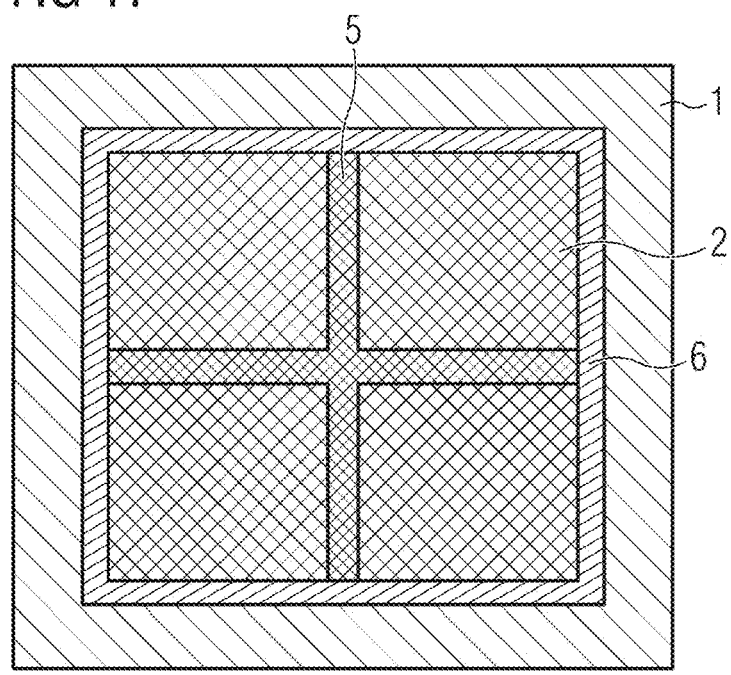

A further schematic top view of the filling of the gaps in an exemplary radiation detector with four butted converting layer tiles is shown in FIGS. 15 to 17, the figures showing the state before, during and after the process of filling the gap between tiles with, e.g. liquefied, radiation converting material as semiconductor. In FIG. 15 the first, pixelated electrode layer 1 is shown, e.g. in the form of an active matrix backplane substrate (glass or silicon with a-Si, IGZO or CMOS TFT circuitry) including also a bottom electrode per each pixel, on which a second layer 6 is applied as adhesion promoting layer, using e.g. a suitable semiconductor, and on top thereof four tiles of the first layer 2 are applied as butted converting layer tiles, leaving gaps between them. In FIG. 15 then an exemplary liquid material comprising at least a first semiconductor and/or at least a first perovskite 5' is then filled in the gaps using applicator 5", e.g. a dispensing apparatus for filling the gap with liquified radiation converting material (semiconductor). Upon hardening the material comprising at least a first semiconductor and/or at least a first perovskite 5 is obtained in the gaps in solid state, e.g. as recrystallized perovskite.

The above embodiments can be combined arbitrarily, if appropriate. Further possible embodiments and implementations of example embodiments comprise also combinations of features not explicitly mentioned in the foregoing or in the following with regard to example embodiments. Particularly, a person skilled in the art will also add individual aspects as improvements or additions to the respective basic form of example embodiments.

Example embodiments will now be described in detail with reference to several examples thereof. However, these examples are illustrative and do not limit the scope of example embodiments.

On a first electrode layer with electrode pixels, made e.g. of ITO or Pt, a structure is formed using SU-8 as photoresist. Upon hardening MAPI ($CH_3NH_3PbI_3$) is filled in the structure, e.g. as powder, liquefied with MA gas, and then recrystallized, thus filling the structure. On top thereof soft-sintered tiles made of MAPI ($CH_3NH_3PbI_3$), e.g. 4 as shown in FIG. 15, are placed, forming gaps between them. The gaps are then filled with MAPI as powder, which is liquefied using MA gas, or in liquefied form, and then the MAPI in the gaps is recrystallized and hardened. On top thereof a second electrode made of e.g. Cr, Ti, or ITO is applied.

The MAPI in the gaps differed from the MAPI in the soft-sintered tiles with regard to the morphology, and also differences could be observed in grain sizes, grain boundaries, density, and porosity, and the material in the tiles and the material in the gaps can be clearly distinguished. As a consequence, also the electric signal, respectively the sensitivity, was different when comparing the signal from the tiles and the signal from the material in the gaps. However, the material in the gaps still contributed to the signal in imaging. Also, the MAPI filled in the structure had a different morphology, etc., compared to the MAPI in the tiles.

In the present detector tiles comprising a radiation absorbing and converting material can be used which can be produced at low cost, e.g. in hydraulic presses and/or isostatic presses using low pressure, using smaller pressing tools. Particularly when a perovskite is used in the tiles, handling thereof is easier compared to big absorber layers as perovskite is brittle, yielding better efficiency. As the gaps between the tiles are then filled with a semiconductor or even a radiation absorbing material, no dead zones generating defective lines, row or columns are obtained in the raw image when using the detector in imaging, as the gaps are filled and do not represent dead zones any more. With the detectors, further also higher sensitivity and resolution may be possible as the tiles can be easier produced with higher precision.

The invention claimed is:

1. A detector for electromagnetic radiation comprising:
a first pixelated electrode layer, the first pixelated electrode layer comprising a plurality of electrode pixels;
a first layer comprising a plurality of tiles, the plurality of tiles comprising a material configured to absorb and convert the electromagnetic radiation, wherein the first layer comprises gaps between the tiles, wherein the gaps are filled with at least one of at least a first semiconductor or at least a first perovskite and the at least one of the at least the first semiconductor or the at least the first perovskite is configured to contribute to a signal in the plurality of electrode pixels in the first pixelated electrode layer; and
a second electrode layer,
wherein the material configured to absorb and convert the electromagnetic radiation is a second perovskite.

2. The detector for electromagnetic radiation of claim 1, further comprising:
at least one interlayer
between the first pixelated electrode layer and the first layer,
between the first layer and the second electrode layer, or
between the first pixelated electrode layer and the first layer and between the first layer and the second electrode layer.

3. The detector for electromagnetic radiation of claim 2, further comprising:
a second layer between the first, pixelated electrode layer and the first layer, wherein the second layer is an adhesion promoting layer, the second layer comprises at least one of a second semiconductor, a conductor or a third perovskite.

4. The detector for electromagnetic radiation of claim 3, further comprising:
the at least one interlayer at least one of (i) between the first pixelated electrode layer and the second layer or (ii) between the second layer and the first layer.

5. The detector for electromagnetic radiation of claim 3, wherein the second layer is a structured layer, the second layer comprising a structure and a material comprising at least one of the second semiconductor, the conductor or the third perovskite filled at least one of (i) in the structure or (ii) surrounding the structure.

6. The detector for electromagnetic radiation of claim 1, wherein the tiles have a size in a range of 1×1 cm$^2$ to 50×50 cm$^2$.

7. The detector for electromagnetic radiation of claim 1, wherein the gaps between the tiles have a width of 0.1 pixel pitches to 50 pixel pitches, wherein a pixel pitch has a length of between and including 10 µm and 1000 µm.

8. The detector for electromagnetic radiation of claim 1, wherein two adjacent tiles in the first layer have a tilt angle between tiles between and including 0° and 5°.

9. The detector for electromagnetic radiation of claim 1, further comprising:
at least one interlayer at least one of (i) between the first pixelated electrode layer and a second layer or (ii) between the second layer and the first layer.

10. A detector for electromagnetic radiation comprising:
a first pixelated electrode layer, the first pixelated electrode layer comprising a plurality of electrode pixels;
a first layer comprising a plurality of tiles, the plurality of tiles comprising a material configured to absorb and convert the electromagnetic radiation, wherein the first layer comprises gaps between the tiles, wherein the gaps are filled with at least one of at least a first semiconductor or at least a first perovskite and the plurality of tiles comprise at least a second perovskite, the second perovskite being the material configured to absorb and convert the electromagnetic radiation;
a second electrode layer; and
a second layer between the first, pixelated electrode layer and the first layer, wherein the second layer is an adhesion promoting layer, the second layer comprises at least one of a second semiconductor, a conductor or a third perovskite.

11. The detector for electromagnetic radiation of claim 10, wherein the second layer is a structured layer, the second layer comprising a structure and a material comprising at least one of the second semiconductor, the conductor or the third perovskite filled at least one of (i) in the structure or (ii) surrounding the structure.

12. The detector for electromagnetic radiation of claim 11, wherein the gaps between the tiles have a width of 0.1 pixel pitches to 50 pixel pitches, wherein a pixel pitch has a length of between and including 10 µm and 1000 µm.

13. The detector for electromagnetic radiation of claim 11, wherein two adjacent tiles in the first layer have a tilt angle between tiles between and including 0° and 5°.

14. The detector for electromagnetic radiation of claim 11, wherein the tiles have a size in a range of 1×1 cm$^2$ to 50×50 cm$^2$.

15. The detector for electromagnetic radiation of claim 10, further comprising:
at least one interlayer at least one of (i) between the first pixelated electrode layer and the second layer or (ii) between the second layer and the first layer.

16. The detector for electromagnetic radiation of claim 15, wherein the second layer is a structured layer, the second layer comprising a structure and a material comprising at least one of the second semiconductor, the conductor or the third perovskite filled at least one of (i) in the structure or (ii) surrounding the structure.

* * * * *